(12) United States Patent  
Saito

(10) Patent No.: US 10,396,856 B2  
(45) Date of Patent: Aug. 27, 2019

(54) SEMICONDUCTOR DEVICE

(71) Applicant: PEZY Computing K.K., Chiyoda-ku, Tokyo (JP)

(72) Inventor: Motoaki Saito, Tokyo (JP)

(73) Assignee: PEZY COMPUTING K.K., Chiyoda-Ku, Tokyo (JP)

( * ) Notice: Subject to any disclaimer, the term of this patent is extended or adjusted under 35 U.S.C. 154(b) by 0 days.

(21) Appl. No.: 15/754,553

(22) PCT Filed: Sep. 2, 2015

(86) PCT No.: PCT/JP2015/074915  
§ 371 (c)(1),  
(2) Date: Feb. 22, 2018

(87) PCT Pub. No.: WO2017/037883  
PCT Pub. Date: Mar. 9, 2017

(65) Prior Publication Data  
US 2018/0248585 A1 Aug. 30, 2018

(51) Int. Cl.  
*H04B 5/00* (2006.01)  
*G06N 3/063* (2006.01)  
(Continued)

(52) U.S. Cl.  
CPC .......... *H04B 5/0031* (2013.01); *G06N 3/063* (2013.01); *H01F 5/003* (2013.01); *H01L 21/822* (2013.01);  
(Continued)

(58) Field of Classification Search  
CPC .. H04B 5/0031; H04B 5/0093; H04B 5/0081; H04B 1/40; H04B 1/04; H04B 1/16;  
(Continued)

(56) References Cited

U.S. PATENT DOCUMENTS 5,371,835 A 12/1994 Akamatsu et al.  
6,321,067 B1 11/2001 Suga et al.  
(Continued)

FOREIGN PATENT DOCUMENTS

JP H06-243117 A 9/1994  
JP 7-141313 A 6/1995  
(Continued)

*Primary Examiner* — Andrew Wendell  
(74) *Attorney, Agent, or Firm* — Muncy, Geissler, Olds & Lowe, P.C.

(57) ABSTRACT

A semiconductor device includes a first semiconductor chip and a second semiconductor chip The first semiconductor chip includes a transmission circuit input unit, a transmission circuit unit, and a transmission unit. The second semiconductor chip includes a reception unit, a reception circuit unit, and a reception circuit output unit. The transmission unit and the reception unit can communicate with each other in a non-contact manner. A transmission circuit unit input signal having a predetermined transmission-side potential is input into the transmission circuit unit. A reception circuit unit input signal is input into the reception circuit unit via the non-contact communication between the transmission unit and the reception unit. The reception circuit unit outputs a reception circuit unit output signal having a predetermined reception-side potential. The ratio of the reception-side potential to the transmission-side potential can be changed.

10 Claims, 10 Drawing Sheets

(51) Int. Cl.
*H01L 21/822* (2006.01)
*H01L 27/04* (2006.01)
*H01F 5/00* (2006.01)
*H01L 23/64* (2006.01)

(52) U.S. Cl.
CPC ............ *H01L 23/645* (2013.01); *H01L 27/04* (2013.01); *H04B 5/0081* (2013.01); *H04B 5/0093* (2013.01)

(58) Field of Classification Search
CPC ..... H01L 23/645; H01L 27/04; H01L 21/822; H01F 5/003; G06N 3/063
See application file for complete search history.

(56) References Cited

U.S. PATENT DOCUMENTS

| | | |
|---|---|---|
| 7,403,090 B2 | 7/2008 | Kita |
| 8,190,086 B2 | 5/2012 | Sasaki et al. |
| 8,283,944 B2 | 10/2012 | Kuroda |
| 8,423,850 B2 | 4/2013 | Iwata et al. |
| 9,722,449 B2 | 8/2017 | Jung |
| 10,075,025 B2 * | 9/2018 | Ichikawa ............ H02J 7/025 |
| 2002/0167849 A1 * | 11/2002 | Ohbayashi ............ G11C 29/50 365/189.09 |
| 2003/0206048 A1 * | 11/2003 | Toyoshima ........... H04L 25/061 327/524 |
| 2005/0040885 A1 * | 2/2005 | Hayashi .................... G05F 3/30 327/543 |
| 2007/0018768 A1 * | 1/2007 | Kita ........................ H01F 5/003 336/200 |
| 2009/0233546 A1 * | 9/2009 | Sasaki ...................... H04B 5/02 455/41.1 |
| 2010/0040123 A1 | 2/2010 | Iwata et al. |
| 2011/0102015 A1 | 5/2011 | Kuroda |
| 2013/0285465 A1 | 10/2013 | Takeda et al. |
| 2014/0285140 A1 | 9/2014 | Jung |
| 2015/0115727 A1 | 4/2015 | Carobolante et al. |
| 2016/0004894 A1 * | 1/2016 | Tanikawa ................ H04B 1/59 340/10.51 |
| 2016/0337152 A1 * | 11/2016 | Masui ...................... H04W 4/70 |

FOREIGN PATENT DOCUMENTS

| | | |
|---|---|---|
| JP | H10-145987 A | 5/1998 |
| JP | 2001-238372 A | 8/2001 |
| JP | 3392016 B2 | 3/2003 |
| JP | 2007-035738 A | 2/2007 |
| JP | 2010-015654 A | 1/2010 |
| JP | 2010-158151 A | 7/2010 |
| JP | 2013-229812 A | 11/2013 |
| JP | 2014-183740 A | 9/2014 |
| WO | WO2007/029435 A1 | 3/2007 |
| WO | WO2008/056739 A1 | 5/2008 |

* cited by examiner

SEMICONDUCTOR DEVICE

TECHNICAL FIELD

The present invention relates to a semiconductor device which includes a plurality of semiconductor chips and in which non-contact communication can be performed between the semiconductor chips.

BACKGROUND ART

Conventionally, a semiconductor device is known which includes a plurality of semiconductor chips and in which non-contact communication can be performed between the semiconductor chips. In the semiconductor device, each semiconductor chip includes a transmission unit, a transmission coil, a reception coil, and a reception unit. A transmission signal of one semiconductor chip is transmitted to another semiconductor chip via the transmission unit and the transmission coil. The transmission signal that has been transmitted via the transmission unit and the transmission coil is received as a reception signal via a reception coil and a reception unit of another semiconductor chip (refer to Patent Documents 1 and 2). Communication between one semiconductor chip and another semiconductor chip is non-contact communication because the communication is performed by magnetic coupling (inductive coupling) of the transmission coil and the reception coil.

It is known that the semiconductor device in which non-contact communication can be performed between the semiconductor chips is used for a neuro-semiconductor device (refer to Patent Document 2). The neuro-semiconductor device is a semiconductor device having a function imitating a function of human cerebral nerve cells and it is sometimes referred to as a neuro-synaptic processing unit. The neuro-semiconductor device includes a plurality of neuron portions and a plurality of synaptic connection portions. In addition, in the neuro-semiconductor device, the plurality of neuron portions are connected via the plurality of synaptic connection portions. In the neuro-semiconductor device of Patent Document 2, the two coils performing the non-contact communication configure a part of synaptic connection.

Patent Document 1: Japanese Unexamined Patent Application, Publication No. 2010-15654

Patent Document 2: Japanese Unexamined Patent Application, Publication No. H06-243117

DISCLOSURE OF THE INVENTION

Problems to be Solved by the Invention

The semiconductor device in which the non-contact communication can be performed between the semiconductor chips is expected to be used for various uses in the future. A use of the neuro-semiconductor device described in Patent Document 2 is an example of the various uses. The inventors have thought that it may be important to specify a relationship between a potential of the transmission signal and a potential of the reception signal to enable the semiconductor device in which the non-contact communication can be performed between the semiconductor chips to be used for the various uses. However, Patent Document 1 and Patent Document 2 do not describe the potential of the transmission signal and the potential of the reception signal.

It is an object of the present invention to provide a semiconductor device which includes a plurality of semiconductor chips in which non-contact communication can be performed between the semiconductor chips and which can be used for various uses.

Means for Solving the Problems (1) The present invention relates to a semiconductor device. The semiconductor device includes a first semiconductor chip that includes a transmission circuit input unit, a transmission circuit unit connected to the transmission circuit input unit, and a transmission unit connected to the transmission circuit unit and a second semiconductor chip that is disposed on or below the first semiconductor chip and includes a reception unit, a reception circuit unit connected to the reception unit, and a reception circuit output unit connected to the reception circuit unit. In the semiconductor device, the transmission unit and the reception unit communicate with each other in a non-contact manner, a transmission circuit unit input signal having a predetermined transmission-side potential is input to the transmission circuit unit via the transmission circuit input unit, the transmission circuit unit outputs a transmission circuit unit output signal corresponding to the transmission circuit unit input signal, and the transmission circuit unit output signal is input as a reception circuit unit input signal to the reception circuit unit via the non-contact communication between the transmission unit and the reception unit, the reception circuit unit outputs a reception circuit unit output signal corresponding to a voltage of the reception circuit unit input signal and having a predetermined reception-side potential, to the reception circuit output unit, and a ratio of the reception-side potential to the transmission-side potential is changed.

(2) The transmission unit may be a transmission coil and the reception unit may be a reception coil.

(3) The reception coil may be a variable turn number reception coil capable of changing a number of turns, the reception circuit unit may have a reception coil turn number control unit that changes the number of turns of the variable turn number reception coil, and the reception coil turn number control unit may change the number of turns of the variable turn number reception coil to change the ratio of the reception-side potential to the transmission-side potential.

(4) The transmission coil may be a variable turn number transmission coil capable of changing the number of turns, the transmission circuit unit may have a transmission coil turn number control unit that changes the number of turns of the variable turn number transmission coil, and the transmission coil turn number control unit may change the number of turns of the variable turn number transmission coil to change the ratio of the reception-side potential to the transmission-side potential.

(5) The reception coil may have a plurality of reception coils, the reception circuit unit may have a reception coil selection unit that selects any one of the plurality of reception coils, and the reception coil selection unit may change the reception coil to be selected, thereby changing the ratio of the reception-side potential to the transmission-side potential.

(6) The transmission unit may have a plurality of transmission coils, the transmission circuit unit may have a transmission coil selection unit that selects at least one of the plurality of coils, and the transmission coil selection unit may change the transmission coil to be selected, thereby changing the ratio of the reception-side potential to the transmission-side potential.

(7) The reception circuit unit may have a reception circuit voltage variable amplification unit that amplifies the reception circuit unit input signal and outputs the reception circuit unit output signal and a variable amplification factor control unit that controls the reception circuit voltage variable amplification unit to change an amplification factor of the reception circuit voltage variable amplification unit and the variable amplification factor control unit may control the reception circuit voltage variable amplification unit to change the amplification factor of the reception circuit voltage variable amplification unit, thereby changing the ratio of the reception-side potential to the transmission-side potential.

(8) The transmission circuit unit may have a transmission circuit variable current amplification unit that outputs a transmission unit output current signal having a current corresponding to the transmission-side potential to the transmission coil and a variable current control unit that controls the transmission circuit variable current amplification unit to change the current of the transmission unit output current signal and the variable current control unit may control the transmission circuit variable current amplification unit to change the current of the transmission unit output current signal, thereby changing the ratio of the reception-side potential to the transmission-side potential.

(9) The semiconductor device may include a plurality of semiconductor chips, the semiconductor chips adjacent to each other in a vertical direction may be bonded directly to each other, and each of the first semiconductor chip and the second semiconductor chip may be one of the plurality of semiconductor chips.

(10) The present invention relates to a semiconductor device including the semiconductor device according to any one of (1) to (9). The semiconductor device further includes a plurality of synaptic connection portions, each of which has a synaptic connection input unit and a synaptic connection output unit, and a plurality of neuron portions that are connected to each other via the plurality of synaptic connection portions. In the semiconductor device, the synaptic connection input unit is the transmission circuit input unit, the synaptic connection output unit is the reception circuit output unit, and a weighting coefficient of the synaptic connection portion is changed by changing the ratio of the transmission-side potential and the reception-side potential.

(11) The weighting coefficient of the synaptic connection portion may be changed according to the number of transmission circuit unit input signals input to the transmission circuit input unit per unit time.

(12) The weighting coefficient of the synaptic connection portion may be reduced with time while the transmission circuit unit input signal is not input to the transmission circuit input unit.

EFFECTS OF THE INVENTION

According to the present invention, it is possible to provide a semiconductor device which includes a plurality of semiconductor chips in which non-contact communication can be performed between the semiconductor chips and which can be used for various uses.

BRIEF DESCRIPTION OF THE DRAWINGS

FIGS. 11A and 11B are diagrams for explaining a neuro-semiconductor device according to a fifth embodiment, in which FIG. 11A is a diagram for explaining a neuro-network in the neuro-semiconductor device, and FIG. 11B is a diagram for explaining a synaptic connection portion.

PREFERRED MODE FOR CARRYING OUT THE INVENTION

In the description of the present specification, "performing communication in a non-contact manner" means that one communication unit performing the communication and another communication unit performing the communication perform the communication without contacting each other and without using a conductive member (at least one of a solder, a conductive adhesive, and a wire). In addition, "performing the communication in a contact manner" means that one communication unit performing the communication and another communication unit performing the communication perform the communication while contacting each other or perform the communication by using a conductive member (at least one of a solder, a conductive adhesive, and a wire). In addition, the communication unit is a concept including a portion performing transmission and reception, a portion performing only the transmission, and a portion performing only the reception.

[First Embodiment]

Figure 1:
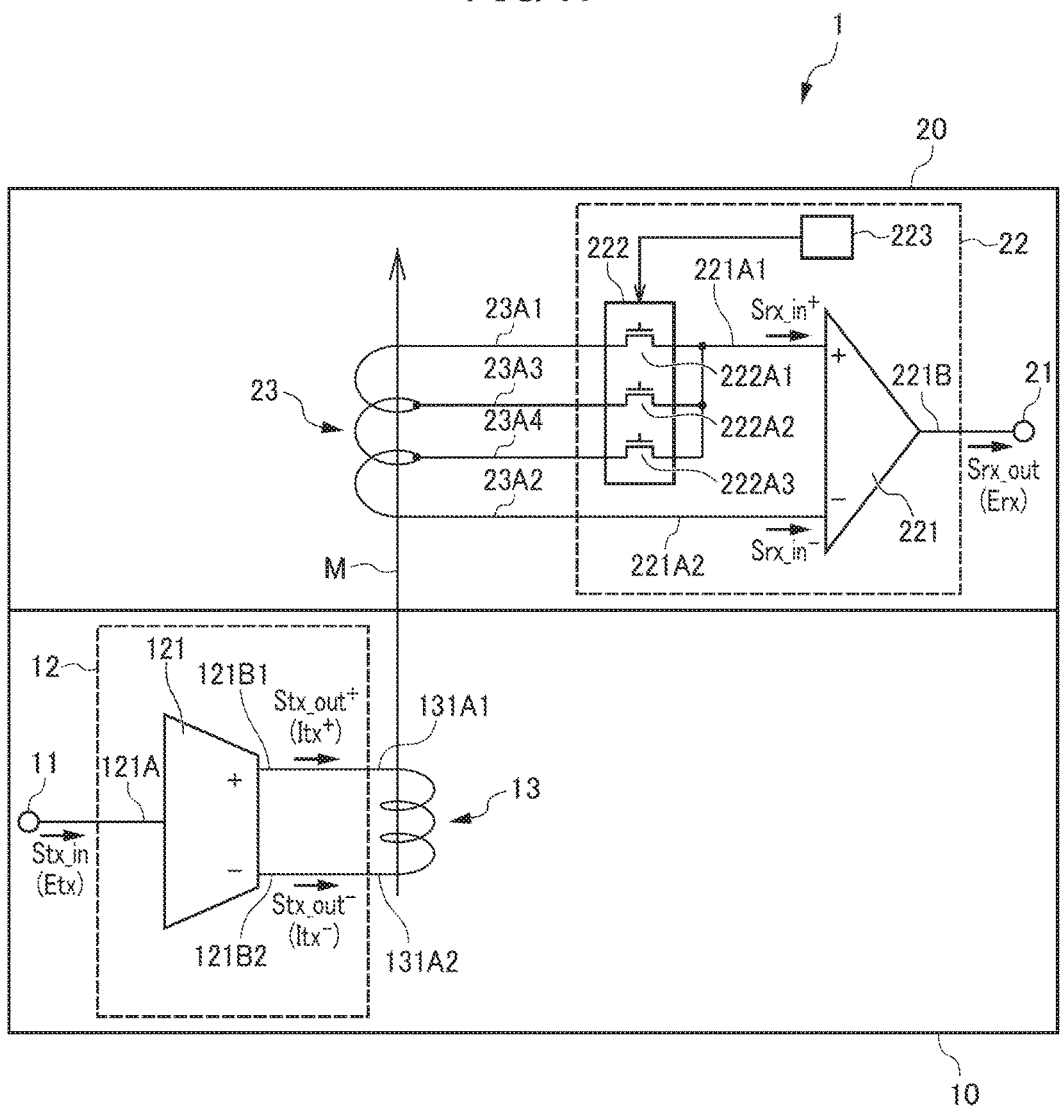
FIG. 1 is a circuit diagram of a semiconductor device according to a first embodiment.
Figure 2:
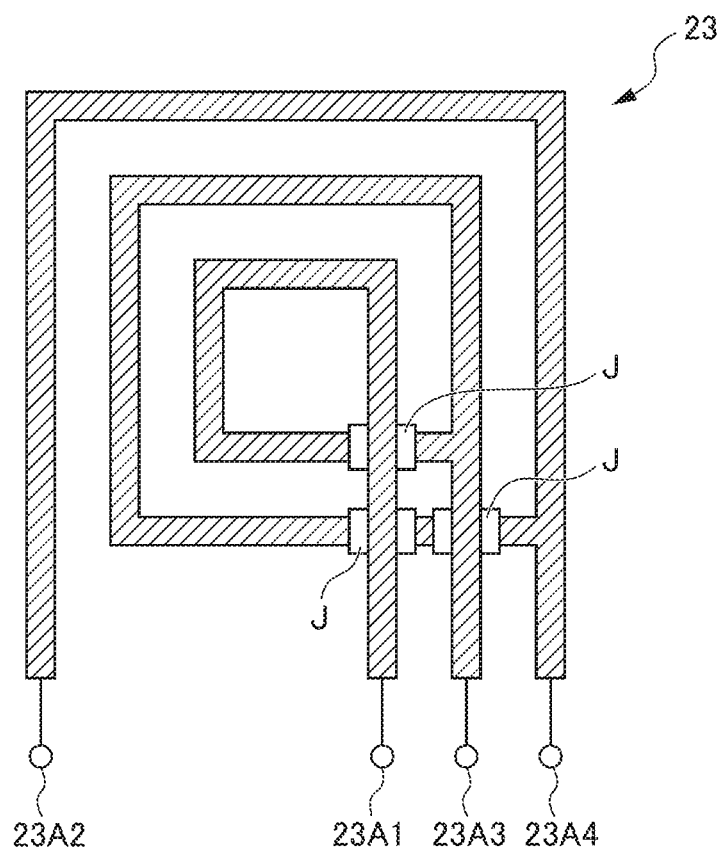
FIG. 2 is a diagram for explaining a configuration of a reception coil in the semiconductor device according to the first embodiment.

Hereinafter, a first embodiment will be described with reference to the drawings. FIG. 1 is a circuit diagram of a configuration of a semiconductor device according to the first embodiment. FIG. 2 is a diagram for explaining a configuration of a reception coil in the semiconductor device according to the first embodiment.

As illustrated in FIG. 1, a semiconductor device 1 includes a first semiconductor chip 10 and a second semiconductor chip 20. An upper principal surface of the first semiconductor chip 10 and a lower principal surface of the second semiconductor chip 20 are bonded by fusion bonding. The semiconductor device 1 includes another semiconductor chip bonded to an upper portion of the second semiconductor chip 20. However, in FIG. 1, illustration of semiconductor chips other than the first semiconductor chip 10 and the second semiconductor chip 20 is omitted. The semiconductor chips other than the first semiconductor chip 10 and the second semiconductor chip 20 will be described later.

The first semiconductor chip 10 includes a transmission circuit input unit 11, a transmission circuit unit 12, and a transmission coil 13 functioning as a transmission unit. The transmission circuit unit 12 has a transmission circuit current amplification unit 121. The transmission circuit current amplification unit 121 has a transmission circuit current amplification unit input terminal 121A, a transmission circuit current amplification unit first output terminal 121B1, and a transmission circuit current amplification unit second output terminal 121B2. The transmission circuit current amplification unit 121 is an amplification unit that outputs a current corresponding to a potential of a signal input to the transmission circuit current amplification unit input terminal 121A from the transmission circuit current amplification unit first output terminal 121B1 and the transmission circuit current amplification unit second output terminal 121B2. The transmission circuit current amplification unit 121 is an amplification unit that is sometimes referred to as a transconductance amplifier. In the transmission circuit current amplification unit 121, the input potential and the output current are in one-to-one correspondence (transconductance is constant).

A polarity of the current output from the transmission circuit current amplification unit first output terminal 121B1 and a polarity of the current output from the transmission circuit current amplification unit second output terminal 121B2 are opposite to each other. That is, the signal output from the transmission circuit current amplification unit 121 is a balanced signal (differential signal). The transmission coil 13 is a coil with a number of turns of 3 (multiple turns) and has two input terminals (a transmission coil first input terminal 131A1 and a transmission coil second input terminal 131A2).

One end of the transmission circuit input unit 11 is connected to a transmission signal processing unit 14 or the like (not illustrated in the drawings). The other end of the transmission circuit input unit 11 is connected to the transmission circuit unit 12. More specifically, the other end of the transmission circuit input unit 11 is connected to the transmission circuit current amplification unit input terminal 121A. The transmission circuit unit 12 is connected to the transmission coil 13. More specifically, the transmission circuit current amplification unit first output terminal 121B1 is connected to the transmission coil first input terminal 131A1 and the transmission circuit current amplification unit second output terminal 121B2 is connected to the transmission coil second input terminal 131A2.

The second semiconductor chip 20 includes a reception coil 23 functioning as a reception unit, a reception circuit unit 22, and a reception circuit output unit 21. The reception coil 23 is a coil with a number of turns of 3 (multiple turns) and has two output terminals (a reception coil first output terminal 23A1 and a reception coil second output terminal 23A2). In addition, a reception coil third output terminal 23A3 and a reception coil fourth output terminal 23A4 are provided between the reception coil first output terminal 23A1 and the reception coil second output terminal 23A2.

The reception circuit unit 22 has a reception circuit voltage amplification unit 221, a reception circuit switch unit 222, and a reception coil turn number control unit 223. The reception circuit voltage amplification unit 221 has a reception circuit voltage amplification unit first input terminal 221A1, a reception circuit voltage amplification unit second input terminal 221A2, and a reception circuit voltage amplification unit output terminal 221B. The reception circuit voltage amplification unit 221 is an amplification unit that amplifies a signal of a voltage corresponding to a voltage of the reception circuit voltage amplification unit first input terminal 221A1 and the reception circuit voltage amplification unit second input terminal 221A2 and outputs the signal from the reception circuit voltage amplification unit output terminal 221B. An amplification factor of the reception circuit voltage amplification unit 221 is constant. A polarity of the voltage input to the reception circuit voltage amplification unit first input terminal 221A1 and a polarity of the voltage input to the reception circuit voltage amplification unit second input terminal 221A2 are opposite to each other. That is, the signal input to the reception circuit voltage amplification unit 221 is a balanced signal (differential signal).

The reception circuit switch unit 222 has a first reception circuit switch 222A1, a second reception circuit switch 222A2, and a third reception circuit switch 222A3. Each switch is composed of a field effect transistor such as an MOS. The reception coil turn number control unit 223 is a control unit that outputs a control signal for controlling the ON/OFF state of each of the first reception circuit switch 222A1, the second reception circuit switch 222A2, and the third reception circuit switch 222A3.

The reception coil first output terminal 23A1 is connected to one end of the first reception circuit switch 222A1. The reception coil second output terminal 23A2 is connected to the reception circuit voltage amplification unit second input terminal 221A2. The reception coil third output terminal 23A3 is connected to one end of the second reception circuit switch 222A2. The reception coil fourth output terminal 23A4 is connected to one end of the third reception circuit switch 222A3. The other end of the first reception circuit switch 222A1, the other end of the second reception circuit switch 222A2, and the other end of the third reception circuit switch 222A3 are connected to the reception circuit voltage amplification unit first input terminal 221A1. The reception circuit voltage amplification unit output terminal 221B is connected to a reception signal processing unit 24 or the like (not illustrated in the drawings).

In FIG. 1, the transmission coil 13 and the reception coil 23 are illustrated as solenoid coils. However, in FIG. 1, to facilitate illustration and description, the transmission coil and the reception coil are illustrated as the solenoid coils. The transmission coil 13 and the reception coil 23 are not limited to the solenoid coils.

Next, an operation of the semiconductor device 1 will be described with reference to FIG. 1. The signal output from the transmission signal processing unit 14 or the like (not illustrated in the drawings) is input as a transmission circuit unit input signal Stx_in to the transmission circuit current amplification unit input terminal 121A via the transmission circuit input unit 11. The transmission circuit unit input signal Stx_in is a signal having a transmission-side potential Etx. The transmission circuit current amplification unit 121 outputs a transmission circuit unit output signal Stx_out$^+$ from the transmission circuit current amplification unit first output terminal 121B1 to the transmission coil first input terminal 131A1 and outputs a transmission circuit unit output signal Stx_out$^-$ from the transmission circuit current amplification unit second output terminal 121B2 to the transmission coil second input terminal 131A2. The transmission circuit unit output signal Stx_out$^+$ is a signal having a current of Itx$^+$. The transmission circuit unit output signal Stx_out$^-$ is a signal having a current of Itx$^-$. Itx$^+$ and Itx$^-$ are currents the high levels and low levels of which are substantially matched (or accurately matched) with each other and their polarities are opposite to each other. It$^+$ and Itx$^-$ flow through the transmission coil 13. As a result, a magnetic field M (magnetic flux B) is generated from the transmission coil 13 to the reception coil 23.

The transmission coil 13 and the reception coil 23 are arranged in a positional relationship that enables magnetic coupling (inductive coupling). For example, the transmission coil 13 and the reception coil 23 are arranged such that centers of the coils are aligned in a vertical direction. Therefore, in the reception coil 23, a voltage Vrx1 corresponding to the magnetic field M (magnetic flux B) is generated between the reception coil first output terminal 23A1 and the reception coil second output terminal 23A2. A voltage Vrx2 corresponding to the magnetic field M (magnetic flux B) is generated between the reception coil third output terminal 23A3 and the reception coil second output terminal 23A2. A voltage Vrx3 corresponding to the magnetic field M (magnetic flux B) is generated between the reception coil fourth output terminal 23A4 and the reception coil second output terminal 23A2. The voltage generated in the reception coil 23 increases when the number of turns increases. In addition, the number of turns of the reception coil 23 becomes the number of turns of 3 between the reception coil first output terminal 23A1 and the reception coil second output terminal 23A2, becomes the number of turns of 2 between the reception coil third output terminal 23A3 and the reception coil second output terminal 23A2, and becomes the number of turns of 1 between the reception coil fourth output terminal 23A4 and the reception coil second output terminal 23A2. Therefore, a magnitude relationship of the generated voltages becomes Vrx1>Vrx2>Vrx3.

The reception coil turn number control unit 223 outputs control signals to turn on any one of the first reception circuit switch 222A1, the second reception circuit switch 222A2, and the third reception circuit switch 222A3 and turn off the other two switches, to the reception circuit switch unit 222. A reception circuit unit input signal Srx_in$^+$ is output to the reception coil first output terminal 23A1 in response to the magnetic field M (magnetic flux B) and a reception circuit unit input signal Srx_in$^-$ is output to the reception coil second output terminal 23A2 in response to the magnetic field M (magnetic flux B). The voltage of each of the reception coil first output terminal 23A1 and the reception coil second output terminal 23A2 becomes any voltage of Vrx1, Vrx2, and Vrx3. The reception coil 23 is controlled by the reception coil turn number control unit 223 and functions as a variable turn number reception coil.

The reception circuit unit input signal Srx_in$^+$ is input to the reception circuit voltage amplification unit first input terminal 221A1 and the reception circuit unit input signal Srx_in$^-$ is input to the reception circuit voltage amplification unit second input terminal 221A2. The reception circuit voltage amplification unit 221 amplifies the input reception circuit unit input signal Srx_in$^+$ and reception circuit unit input signal Srx_in$^-$ and outputs the amplified signals as reception circuit unit output signals Srx_out to the reception signal processing unit 24 or the like (not illustrated in the drawings) via the reception circuit output unit 21. A reception-side potential Erx, being a potential of the reception circuit unit output signal Srx_out, becomes the highest when the voltages of the reception coil first output terminal 23A1 and the reception coil second output terminal 23A2 are Vr1 and becomes the lowest when the voltages of the reception coil first output terminal 23A1 and the reception coil second output terminal 23A2 are Vr3.

As such, in the semiconductor device 1, the reception coil turn number control unit 223 can change the number of turns of the reception coil 23 by controlling the reception circuit switch unit 222. In addition, the number of turns of the reception coil is changed, so that the reception-side potential Erx, being the potential of the reception circuit unit output signal Srx_out output from the reception circuit voltage amplification unit 221, is changed. That is, the semiconductor device 1 is a semiconductor device in which the reception coil turn number control unit 223 changes the number of turns of the reception coil 23, thereby changing a ratio of the reception-side potential Erx, being the potential of the reception circuit unit output signal Srx_out, to the transmission-side potential Etx, being the potential of the transmission circuit unit input signal Stx_in.

Next, a structure of the reception coil 23 will be described with reference to FIG. 2. The reception coil 23 is a spiral coil with the number of turns of 3. The reception coil 23 is provided with four output terminals. The leftmost terminal is the reception coil second output terminal 23A2. The second terminal from the left side is the reception coil first output terminal 23A1. The third terminal from the left side is the reception coil third output terminal 23A3. The fourth terminal from the left side is the reception coil fourth output terminal 23A4. In addition, insulators J are disposed in portions where wiring lines overlap. The reception coil 23 is the variable turn number reception coil that has a number of turns of 3 between the reception coil first output terminal 23A1 and the reception coil second output terminal 23A2, has a number of turns of 2 between the reception coil third output terminal 23A3 and the reception coil second output terminal 23A2, and has a number of turns of 1 between the reception coil fourth output terminal 23A4 and the reception coil second output terminal 23A2. The spiral coil is exemplary and the reception coil 23 may be a solenoid coil of which a screw axis extends in the vertical direction.

According to the semiconductor device 1 according to the first embodiment, the following effects are achieved. The semiconductor device 1 is a semiconductor device that includes the first semiconductor chip 10 including the transmission circuit input unit 11, the transmission circuit unit 12 connected to the transmission circuit input unit 11, and the transmission coil 13 connected to the transmission circuit unit 12 and the second semiconductor chip 20 disposed on or below the first semiconductor chip 10 and including the reception coil 23, the reception circuit unit 22 connected to the reception coil 23, and the reception circuit output unit 21 connected to the reception circuit unit 22. In the semiconductor device 1, the transmission coil 13 and the reception coil 23 can communicate with each other in a non-contact manner by the magnetic coupling (inductive coupling) and the transmission circuit unit input signal Stx_in having the predetermined transmission-side potential Etx is input to the transmission circuit unit 12 via the transmission circuit input unit 11. The transmission circuit unit 12 outputs the transmission circuit unit output signals Stx_out$^+$ and Stx_out$^-$ corresponding to the transmission circuit unit input signal Stx_in and the transmission circuit unit output signals Stx_out$^+$ and Stx_out$^-$ are input as the reception circuit unit input signals Srx_in$^+$ and Srx_in$^-$ to the reception circuit unit 22 via non-contact communication based on the magnetic coupling (inductive coupling) between the transmission coil 13 and the reception coil 23. The reception circuit unit 22 outputs the reception circuit unit output signal Srx_out corresponding to the voltages of the reception circuit unit input signals Srx_in$^+$ and Srx_in$^-$ and having the predetermined reception-side potential Erx, to the reception circuit output unit 21. In the semiconductor device 1, the ratio of the reception-side potential Erx to the transmission-side potential Etx can be changed. Therefore, the semiconductor device 1 can be used for various uses.

More specifically, the reception coil 23 is a variable turn number reception coil capable of changing the number of turns, the reception circuit unit 22 has the reception coil turn number control unit 223 to change the number of turns of the variable turn number reception coil, and the reception coil turn number control unit 223 changes the number of turns of the variable turn number reception coil, thereby changing the ratio of the reception-side potential Erx to the transmission-side potential Etx. Therefore, the semiconductor device 1 can be used for various uses.

[Second Embodiment]

Figure 3:
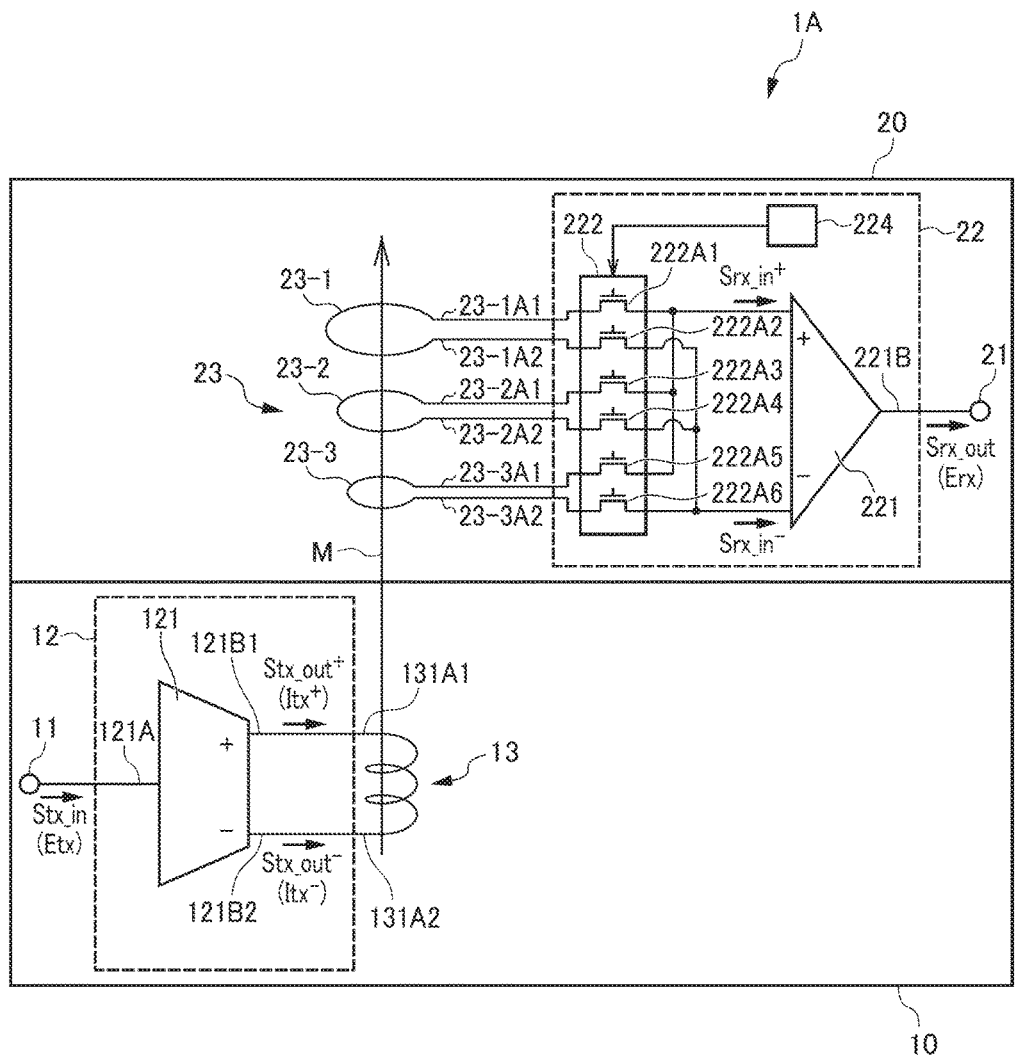
FIG. 3 is a circuit diagram of a semiconductor device according to a second embodiment.
Figure 4:
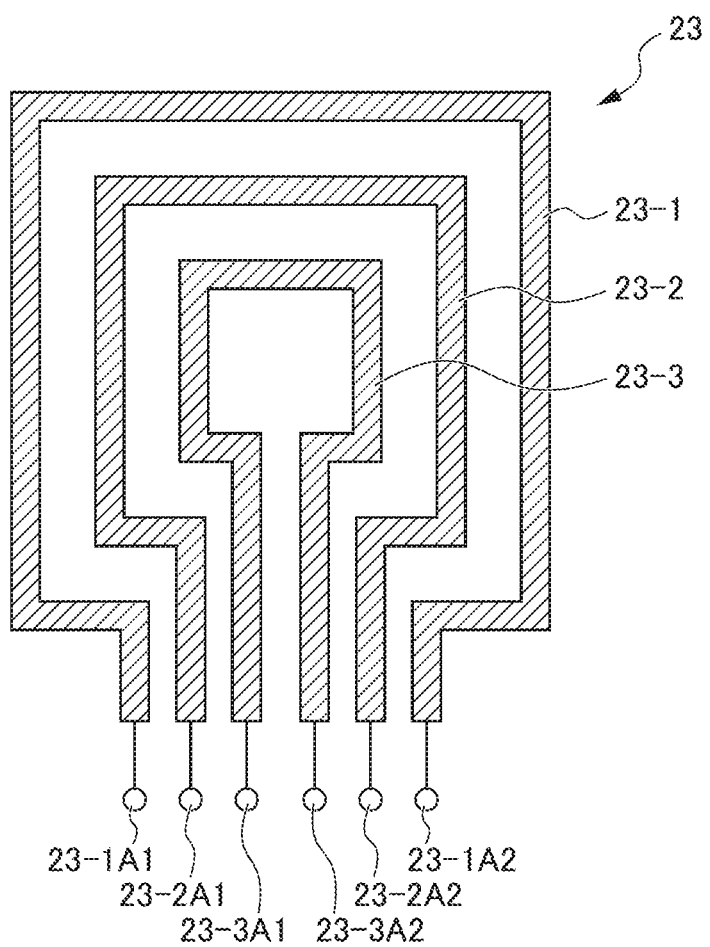
FIG. 4 is a diagram for explaining a configuration of a reception coil in the semiconductor device according to the second embodiment.

Next, a second embodiment will be described with reference to FIGS. 3 and 4. FIG. 3 is a circuit diagram of a semiconductor device according to the second embodiment. FIG. 4 is a diagram for explaining a configuration of a reception coil in the semiconductor device according to the second embodiment. For the second embodiment, mainly the points different to the first embodiment will be described and a description of the same configuration as the configuration of the first embodiment will be omitted. The description of the first embodiment is appropriately applied to points not to be described in particular.

As illustrated in FIG. 3, a semiconductor device 1A according to the second embodiment includes a first semiconductor chip 10 and a second semiconductor chip 20. An upper principal surface of the first semiconductor chip 10 and a lower principal surface of the second semiconductor chip 20 are bonded by fusion bonding. Semiconductor chips other than the first semiconductor chip 10 and the second semiconductor chip 20 will be described later.

The first semiconductor chip 10 includes a transmission circuit input unit 11, a transmission circuit unit 12, and a transmission coil 13 functioning as a transmission unit. The transmission circuit input unit 11, the transmission circuit unit 12, and the transmission coil 13 are the same as those in the semiconductor device 1 according to the first embodiment. A connection relationship of the transmission circuit input unit 11, the transmission circuit unit 12, and the transmission coil 13 is also the same as that in the semiconductor device 1 according to the first embodiment.

The second semiconductor chip 20 includes a reception coil 23, a reception circuit unit 22, and a reception circuit output unit 21. The reception coil 23 includes a first reception coil 23-1, a second reception coil 23-2, and a third reception coil 23-3. The first reception coil 23-1, the second reception coil 23-2, and the third reception coil 23-3 are three independent coils. An area of the first reception coil 23-1 is larger than an area of the second reception coil 23-2 and an area of the third reception coil 23-3 and the area of the second reception coil 23-2 is larger than the area of the third reception coil 23-3.

The first reception coil 23-1 has a first reception coil first terminal 23-1A1 and a first reception coil second terminal 23-1A2. The second reception coil 23-2 has a second reception coil first terminal 23-2A1 and a second reception coil second terminal 23-2A2. The third reception coil 23-3 has a third reception coil first terminal 23-3A1 and a third reception coil second terminal 23-3A2.

The reception circuit unit 22 has a reception circuit voltage amplification unit 221, a reception circuit switch unit 222, and a reception coil selection unit 224. The reception circuit voltage amplification unit 221 is the same as that in the semiconductor device 1 according to the first embodiment. The reception circuit switch unit 222 has a first reception circuit switch 222A1, a second reception circuit switch 222A2, a third reception circuit switch 222A3, a fourth reception circuit switch 222A4, a fifth reception circuit switch 222A5, and a sixth reception circuit switch 222A6. Each switch is composed of a field effect transistor such as an MOS. The reception coil selection unit 224 is a control unit that outputs a control signal for controlling the ON/OFF state of each of the first reception circuit switch 222A1 to the sixth reception circuit switch 222A6.

The first reception coil first terminal 23-1A1 is connected to one end of the first reception circuit switch 222A1. The first reception coil second terminal 23-1A2 is connected to one end of the second reception circuit switch 222A2. The second reception coil first terminal 23-2A1 is connected to one end of the third reception circuit switch 222A3. The second reception coil second terminal 23-2A2 is connected to one end of the fourth reception circuit switch 222A4. The third reception coil first terminal 23-3A1 is connected to one end of the fifth reception circuit switch 222A5. The third reception coil first terminal 23-3A2 is connected to one end of the sixth reception circuit switch 222A6.

The other end of the first reception circuit switch 222A1, the other end of the third reception circuit switch 222A3, and the other end of the fifth reception circuit switch 222A5 are connected to a reception circuit voltage amplification unit first input terminal 221A1. The other end of the second reception circuit switch 222A2, the other end of the fourth reception circuit switch 222A4, and the other end of the sixth reception circuit switch 222A6 are connected to a reception circuit voltage amplification unit second input terminal 221A2.

Next, an operation of the semiconductor device 1A will be described with reference to FIG. 3. Similarly to the semiconductor device 1, in the semiconductor device 1A, a magnetic field M (magnetic flux B) is generated from the transmission coil 13 to the reception coil 23. In the first reception coil 23-1, a voltage Vrx1' corresponding to the magnetic field M (magnetic flux B) is generated. In the second reception coil 23-2, a voltage Vrx2' corresponding to the magnetic field M (magnetic flux B) is generated. In the third reception coil 23-3, a voltage Vrx3' corresponding to the magnetic field M (magnetic flux B) is generated. From the relationship of the area of the first reception coil 23-1, the area of the second reception coil 23-2, and the area of the third reception coil 23-3, Vrx1'>Vrx2'>Vrx3' is obtained.

The reception coil selection unit 224 outputs a control signal to select any one of the first reception coil 23-1, the second reception coil 23-2, and the third reception coil 23-3 to the reception circuit switch unit 222. More specifically, when the reception coil selection unit 224 selects the first reception coil 23-1, the reception coil selection unit 224 turns on the first reception circuit switch 222A1 and the second reception circuit switch 222A2 and turns off the other reception circuit switches. When the reception coil selection unit 224 selects the second reception coil 23-2, the reception coil selection unit 224 turns on the third reception circuit switch 222A3 and the fourth reception circuit switch 222A4 and turns off the other reception circuit switches. When the reception coil selection unit 224 selects the third reception coil 23-3, the reception coil selection unit 224 turns on the fifth reception circuit switch 222A5 and the sixth reception circuit switch 222A6 and turns off the other reception circuit switches.

A reception circuit unit input signal Srx_in$^+$ and a reception circuit unit input signal Srx_in$^-$ are output from the selected coil. When the selected coil is the first reception coil 23-1, a voltage between the coil terminals is Vrx1', when the selected coil is the second reception coil 23-2, a voltage between the coil terminals is Vrx2', and when the selected coil is the third reception coil 23-3, a voltage between the coil terminals is Vrx3'.

The reception circuit unit input signal Srx_in$^+$ is input to the reception circuit voltage amplification unit first input terminal 221A1 and the reception circuit unit input signal Srx_in$^-$ is input to the reception circuit voltage amplification unit second input terminal 221A2. The reception circuit voltage amplification unit 221 amplifies the input reception circuit unit input signal Srx_in$^+$ and reception circuit unit input signal Srx_in$^-$ and outputs the amplified signals as reception circuit unit output signals Srx_out to a reception signal processing unit or the like (not illustrated in the drawings) via the reception circuit output unit 21. When the voltage between the coil terminals is Vr1', a potential of the reception circuit unit output signal Srx_out becomes the highest and when the voltage between the coil terminals is Vr3', the potential of the reception circuit unit output signal Srx_out becomes the lowest.

As such, in the semiconductor device 1A, the reception coil selection unit 224 can change the reception coil 23 connected to the reception circuit voltage amplification unit 221, by controlling the reception circuit switch unit 222. In addition, the reception coil 23 connected to the reception circuit voltage amplification unit 221 is changed, so that a reception-side potential Erx, being the potential of the reception circuit unit output signal Srx_out output from the reception circuit voltage amplification unit 221, is changed. That is, the semiconductor device 1A is a semiconductor device in which the reception coil selection unit 224 selects any one of the first reception coil 23-1, the second reception coil 23-2, and the third reception coil 23-3, thereby changing a ratio of the reception-side potential Erx, being the potential of the reception circuit unit output signal Srx_out, to a transmission-side potential Etx, being a potential of a transmission circuit unit input signal Stx_in.

Next, a structure of the reception coil 23 will be described with reference to FIG. 4. As described above, the reception coil 23 includes the first reception coil 23-1, the second reception coil 23-2, and the third reception coil 23-3. Each of the first reception coil 23-1, the second reception coil 23-2, and the third reception coil 23-3 is a coil with a number of turns of 1. The second reception coil 23-2 is disposed around the third reception coil 23-3 and the first reception coil 23-1 is disposed around the second reception coil 23-2. As such, the first reception coil 23-1, the second reception coil 23-2, and the third reception coil 23-3 are arranged as coaxial coils. The area of the first reception coil 23-1 is larger than the area of the second reception coil 23-2 and the area of the second reception coil 23-2 is larger than the area of the third reception coil 23-3. The first reception coil 23-1, the second reception coil 23-2, and the third reception coil 23-3 are illustrated arranged on the same plane. However, the first reception coil 23-1, the second reception coil 23-2, and the third reception coil 23-3 may not be arranged on the same plane.

According to the semiconductor device 1A according to the second embodiment, the following effects are achieved. The semiconductor device 1A according to the second embodiment is a semiconductor device in which the reception coil 23 has the plurality of reception coils, the reception circuit unit 22 has the reception coil selection unit 224 capable of selecting any one of the plurality of reception coils, and the reception coil selection unit 224 changes the reception coil 23 to be selected, thereby changing the ratio of the reception-side potential Erx to the transmission-side potential Etx. Therefore, the semiconductor device 1A can be used for various uses.

[Third Embodiment]

Figure 5:
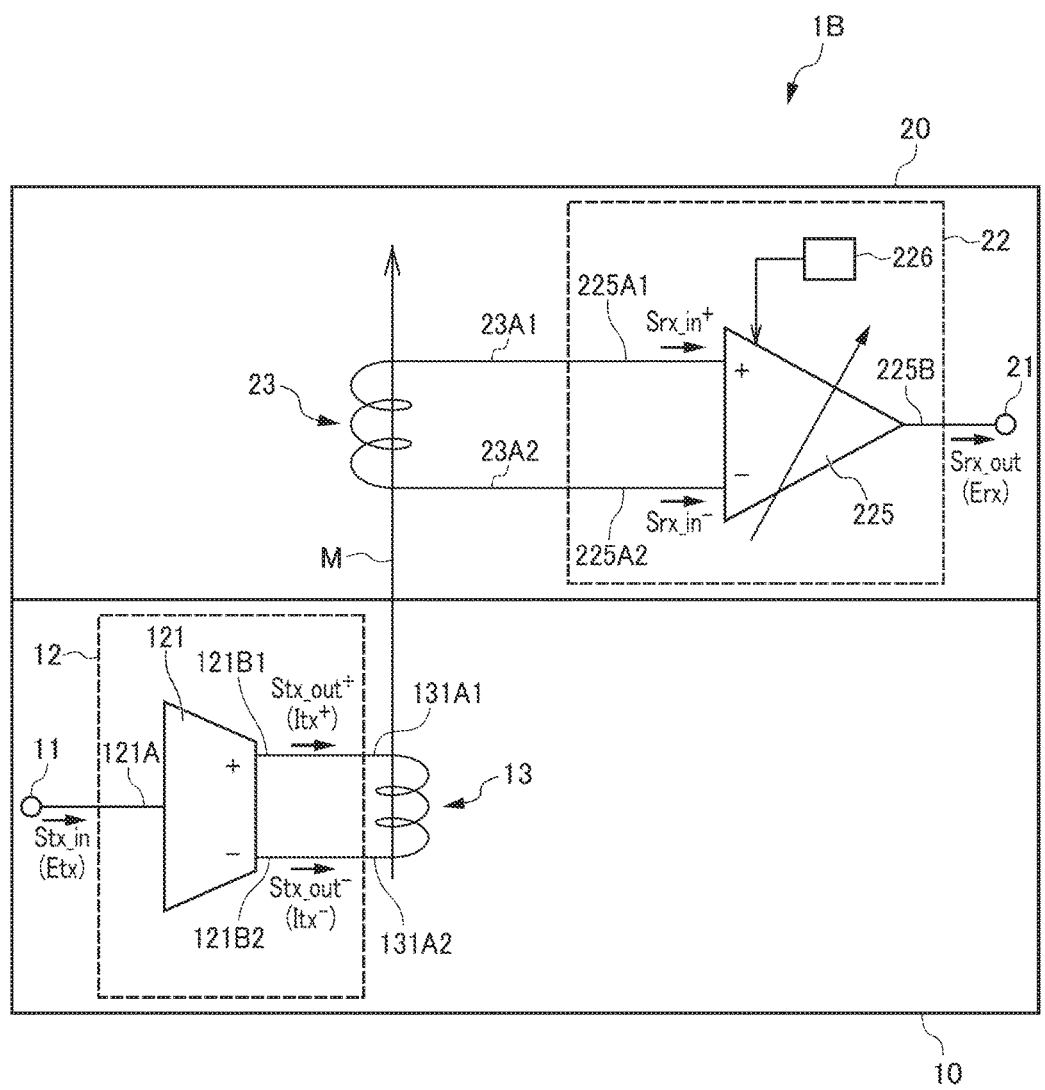
FIG. 5 is a circuit diagram of a semiconductor device according to a third embodiment.
Figure 6:
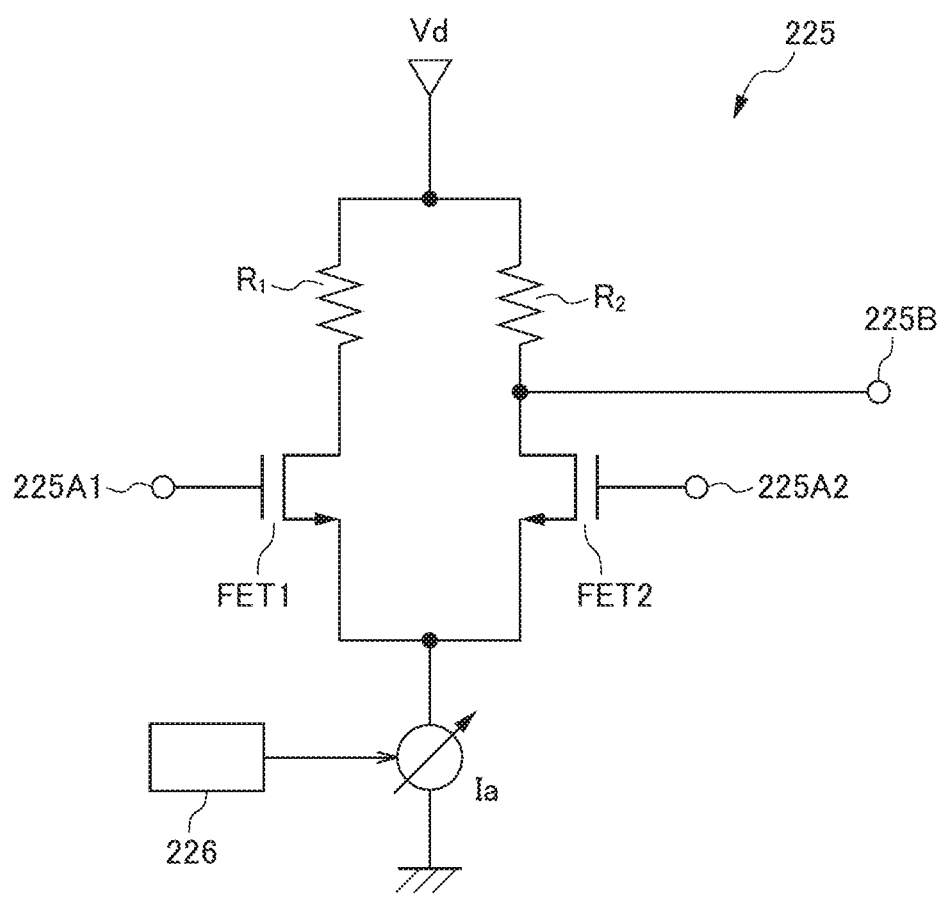
FIG. 6 is a diagram illustrating an example of a reception circuit voltage variable amplification unit in the semiconductor device according to the third embodiment.

Next, a third embodiment will be described with reference to FIGS. 5 and 6. FIG. 5 is a circuit diagram of a semiconductor device according to the third embodiment. FIG. 6 is a diagram illustrating an example of a reception circuit voltage variable amplification unit in the semiconductor device according to the third embodiment. For the third embodiment, mainly the points different to the first embodiment or the second embodiment will be described and a description of the same configuration as the configuration of the first embodiment or the second embodiment will be omitted. The description of the first embodiment or the second embodiment is appropriately applied to points not to be described in particular.

As illustrated in FIG. 5, a semiconductor device 1B according to the third embodiment includes a first semiconductor chip 10 and a second semiconductor chip 20. An upper principal surface of the first semiconductor chip 10 and a lower principal surface of the second semiconductor chip 20 are bonded by fusion bonding. Semiconductor chips other than the first semiconductor chip 10 and the second semiconductor chip 20 will be described later.

The first semiconductor chip 10 includes a transmission circuit input unit 11, a transmission circuit unit 12, and a transmission coil 13 functioning as a transmission unit. The transmission circuit input unit 11, the transmission circuit unit 12, and the transmission coil 13 are the same as those in the semiconductor device 1 according to the first embodiment or the semiconductor device 1A according to the second embodiment. A connection relationship of the transmission circuit input unit 11, the transmission circuit unit 12, and the transmission coil 13 is also the same as that in the semiconductor device 1 according to the first embodiment.

The second semiconductor chip 20 includes a reception coil 23, a reception circuit unit 22, and a reception circuit output unit 21. Similarly to the semiconductor device 1 according to the first embodiment, the reception coil 23 is a spiral coil with a number of turns of 3 (multiple turns). However, although a reception coil first output terminal 23A1 and a reception coil second output terminal 23A2 are provided in the reception coil 23, a reception coil third output terminal 23A3 and a reception coil fourth output terminal 23A4 are not provided in the reception coil 23. That is, the reception coil 23 in the semiconductor device 1B is not a coil of which the number of turns can be changed but a coil of which the number of turns is fixed.

The reception circuit unit 22 has a reception circuit voltage variable amplification unit 225 and a variable amplification factor control unit 226. The reception circuit unit 22 is not provided with a reception coil turn number control unit 223 provided in the semiconductor device 1 according to the first embodiment or the semiconductor device 1A according to the second embodiment.

The reception circuit voltage variable amplification unit 225 is an amplification unit with a changeable amplification factor. The variable amplification factor control unit 226 is a control unit that performs control to change the amplification factor of the reception circuit voltage variable amplification unit 225. The reception circuit voltage variable amplification unit 225 has a reception circuit voltage amplification unit first input terminal 225A1, a reception circuit voltage amplification unit second input terminal 225A2, and a reception circuit voltage amplification unit output terminal 225B. A function of the reception circuit voltage variable amplification unit 225 is the same as that of a reception circuit voltage amplification unit 221, except that the reception circuit voltage variable amplification unit 225 is the amplification unit with the changeable amplification factor.

Next, an operation of the semiconductor device 1B will be described with reference to FIG. 5. Similarly to the semiconductor device 1 or the semiconductor device 1A, in the semiconductor device 1B, a magnetic field M (magnetic flux B) is generated from the transmission coil 13 to the reception coil 23. A voltage Vrx corresponding to the magnetic field M (magnetic flux B) is generated in the reception coil 23. A reception circuit unit input signal Srx_in$^+$ is output to the reception coil first output terminal 23A1 in response to the magnetic field M (magnetic flux B) and a reception circuit unit input signal Srx_in$^-$ is output to the reception coil second output terminal 23A2 in response to the magnetic field M (magnetic flux B). A voltage between the reception coil first output terminal 23A1 and the reception coil second output terminal 23A2 is Vrx.

The reception circuit voltage variable amplification unit 225 amplifies the reception circuit unit input signals Srx_in$^+$ and Srx_in$^-$. The reception circuit voltage variable amplification unit 225 outputs the amplified signals as reception circuit unit output signals Srx_out to a reception signal processing unit or the like (not illustrated in the drawings) via the reception circuit output unit 21. An amplification factor of the reception circuit voltage variable amplification unit 225 is controlled by the variable amplification factor control unit 226. Therefore, a potential of the reception circuit unit output signal Srx_out is changed by control of the variable amplification factor control unit 226.

As such, in the semiconductor device 1B, the variable amplification factor control unit 226 controls the amplification factor of the reception circuit voltage variable amplification unit 225, thereby changing the potential of the reception circuit unit output signal Srx_out output from the reception circuit voltage variable amplification unit 225. That is, the semiconductor device 1B is a semiconductor device in which a ratio of the reception-side potential Erx, being the potential of the reception circuit unit output signal Srx_out, to the transmission-side potential Etx, being the potential of the transmission circuit unit input signal Stx_in, can be changed by changing the amplification factor of the reception circuit voltage amplification unit 221.

Next, a structure of the reception circuit voltage variable amplification unit 225 will be described with reference to FIG. 6. The reception circuit voltage variable amplification unit 225 has a pair of transistors (FET1 and FET2) composed of N-type MOSFETs, a resistor R1 connected between a drain of FET1 and a power supply Vd, a resistor R2 connected between a drain of FET2 and the power supply Vd, and a variable current source Ia connected between the sources of the pair of transistors (FET1 and FET2) and a ground G. A resistance value of the resistor R1 and a resistance value of the resistor R2 are the same.

The reception circuit voltage amplification unit first input terminal 225A1 corresponds to a gate of FET1 and the reception circuit voltage amplification unit second input terminal 225A2 corresponds to a gate of FET2. The reception circuit voltage amplification unit output terminal 225B corresponds to the drain of FET1 or FET2 (corresponds to the drain of FET2 in FIG. 6). In addition, the variable amplification factor control unit 226 is connected to the variable current source Ia. A current of the variable current source Ia is changed by a control voltage output from the variable amplification factor control unit 226. As a result, a drain voltage of FET2 changes. That is, the amplification factor of the reception circuit voltage variable amplification unit 225 is changed by the current of the variable current source Ia. Therefore, the reception circuit voltage variable amplification unit 225 illustrated in FIG. 6 functions as an amplification unit with a variable amplification factor.

The reception circuit unit input signal Srx_in$^+$ is input to the gate of FET1 and the reception circuit unit input signal Srx_in$^-$ is input to the gate of FET2. Srx_out is output from the drain of FET2. The potential of Srx_out is changed by the current of the variable current source Ia. Therefore, the circuit illustrated in FIG. 6 can be used as the reception circuit voltage variable amplification unit 225. In the reception circuit voltage variable amplification unit 225, a pair of transistors composed of P-type MOSFETs may be used.

According to the semiconductor device 1B according to the third embodiment, the following effects are achieved. The semiconductor device 1B according to the third embodiment is a semiconductor device in which the reception circuit unit 22 has the reception circuit voltage variable amplification unit 225 that amplifies the reception circuit unit input signals Srx_in$^+$ and Srx_in$^-$ and outputs the reception circuit unit output signals Srx_out and the variable amplification factor control unit 226 that controls the reception circuit voltage variable amplification unit 225 to change the amplification factor of the reception circuit voltage variable amplification unit 225 and the variable amplification factor control unit 226 controls the reception circuit voltage variable amplification unit 225 to change the amplification factor of the voltage amplification unit, thereby changing the ratio of the reception-side potential Erx to the transmission-side potential Etx. Therefore, the semiconductor device 1B can be used for various uses.

[Fourth Embodiment]

Figure 7:
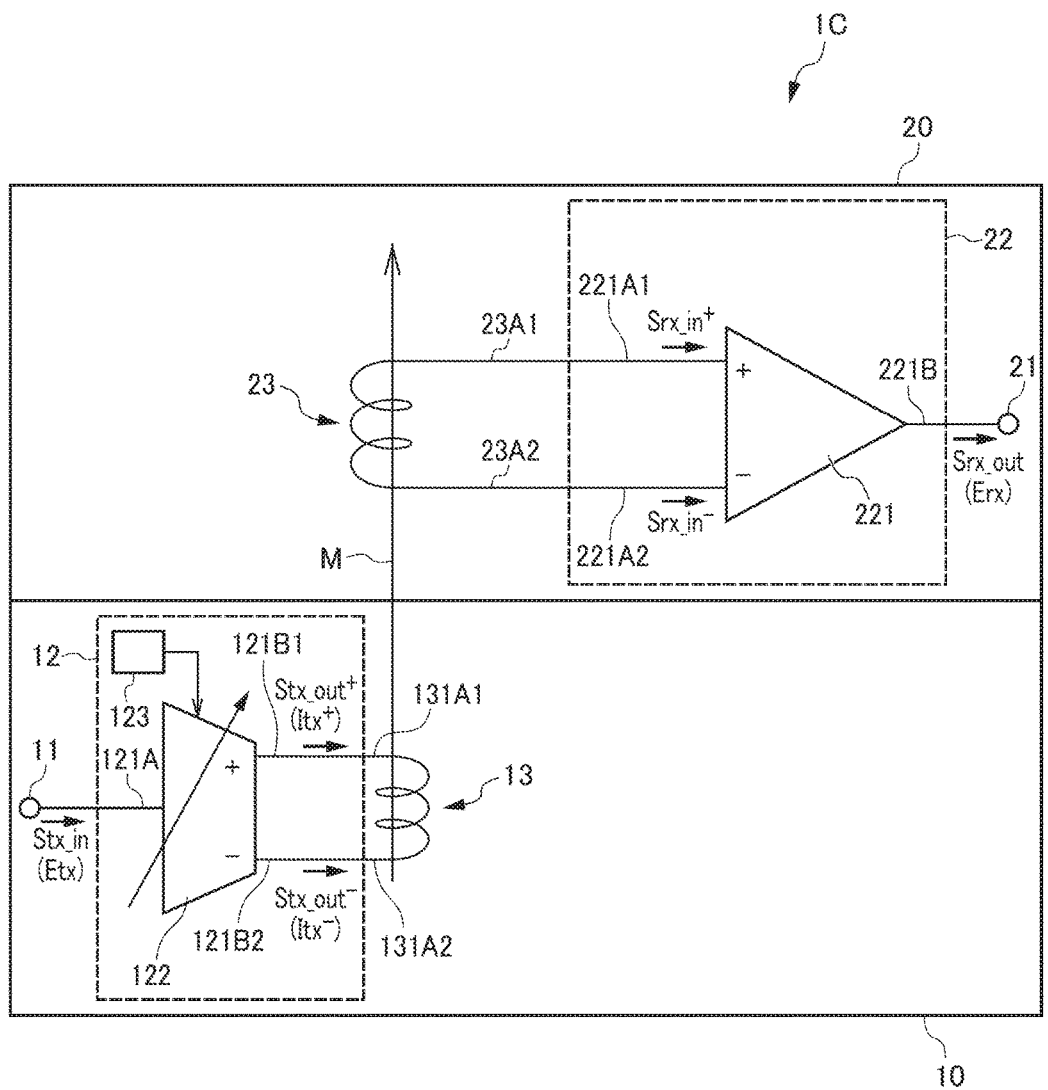
FIG. 7 is a circuit diagram of a semiconductor device according to a fourth embodiment.
Figure 8:
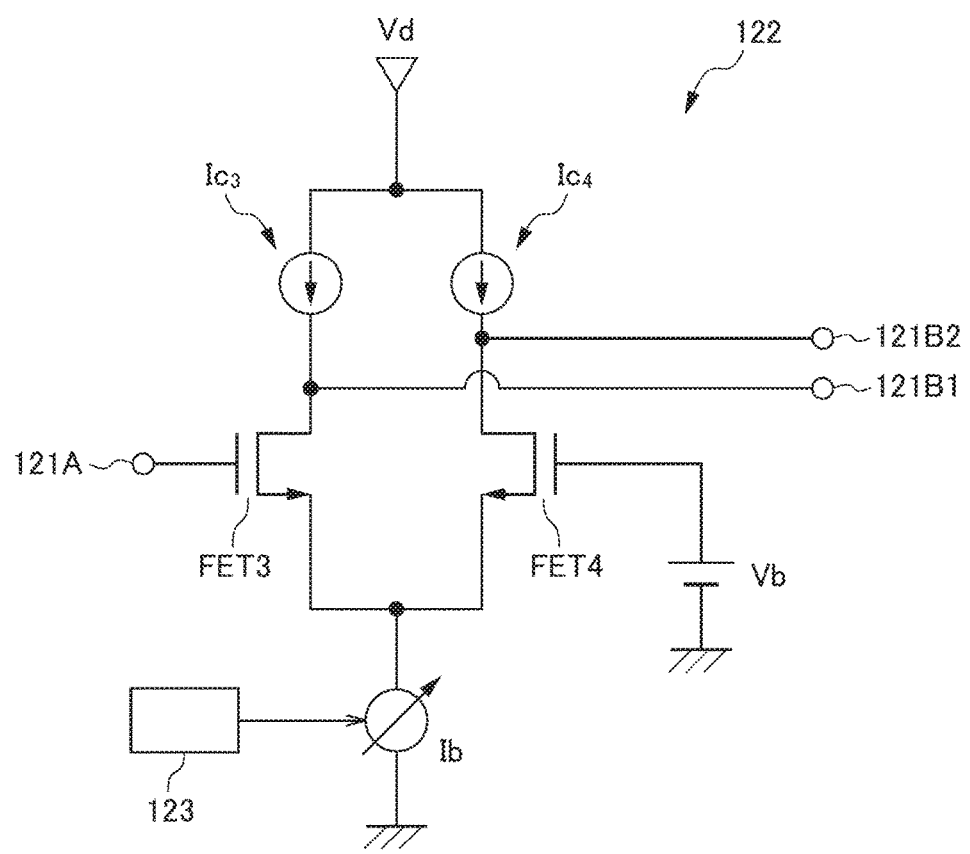
FIG. 8 is a diagram illustrating an example of a transmission circuit variable current amplification unit in the semiconductor device according to the fourth embodiment.

Next, a fourth embodiment will be described with reference to FIGS. 7 and 8. FIG. 7 is a circuit diagram of a semiconductor device according to the fourth embodiment. FIG. 8 is a diagram illustrating an example of a transmission circuit variable current amplification unit in the semiconductor device according to the fourth embodiment. For the fourth embodiment, mainly the points different to the first to third embodiments (particularly, the third embodiment) will be described and a description of the same configuration as the configurations of the first to third embodiments (particularly, the third embodiment) will be omitted. The description of the first to third embodiments (particularly, the third embodiment) is appropriately applied to points not to be described in particular.

As illustrated in FIG. 7, a semiconductor device 1C according to the fourth embodiment includes a first semiconductor chip 10 and a second semiconductor chip 20. An upper principal surface of the first semiconductor chip 10 and a lower principal surface of the second semiconductor chip 20 are bonded by fusion bonding. Semiconductor chips other than the first semiconductor chip 10 and the second semiconductor chip 20 will be described later.

The first semiconductor chip 10 includes a transmission circuit input unit 11, a transmission circuit unit 12, and a transmission coil 13 functioning as a transmission unit. The transmission circuit input unit 11 and the transmission coil 13 are the same as those in the semiconductor device 1, the semiconductor device 1A, and the semiconductor device 1B.

The transmission circuit unit 12 is different from the transmission circuit units according to the first to third embodiments in that the transmission circuit unit 12 has a transmission circuit variable current amplification unit 122 and a variable current control unit 123. The transmission circuit variable current amplification unit 122 is an amplification unit that can change an output current. The transmission circuit variable current amplification unit 122 can be expressed as an amplification unit capable of changing a ratio of an output current to an input signal having a predetermined potential or a variable transconductance amplifier. The transmission circuit variable current amplification unit 122 has a transmission circuit current amplification unit input terminal 121A, a transmission circuit current amplification unit first output terminal 121B1, and a transmission circuit current amplification unit second output terminal 121B2. A function of the transmission circuit variable current amplification unit 122 is the same as that of a transmission circuit current amplification unit 121, except that the transmission circuit variable current amplification unit 122 is an amplification unit capable of changing the output current. The variable current control unit 123 is a control unit that performs control to change the output current of the transmission circuit variable current amplification unit 122.

The second semiconductor chip 20 includes a reception coil 23, a reception circuit unit 22, and a reception circuit output unit 21. The reception coil 23 and the reception circuit output unit 21 are the same as those in the semiconductor device 1B according to the third embodiment. The reception circuit unit 22 has a reception circuit voltage amplification unit 221. The reception circuit unit 22 is provided with the reception circuit voltage amplification unit 221 instead of a reception circuit voltage variable amplification unit 225 and is not provided with a variable amplification factor control unit 226.

Next, an operation of the semiconductor device 1B will be described with reference to FIG. 7. A transmission signal Stx output from a transmission signal processing unit or the like (not illustrated in the drawings) is input to the transmission circuit current amplification unit input terminal 121A via the transmission circuit input unit 11. The transmission signal Stx is a signal having a transmission-side potential Etx. The transmission circuit variable current amplification unit 122 outputs a transmission current $Itx^+$ from the transmission circuit current amplification unit first output terminal 121B1 to the transmission coil first input terminal 131A1 and outputs a transmission current $Itx^-$ from the transmission circuit current amplification unit second output terminal 121B2 to the transmission coil second input terminal 131A2. The transmission currents $Itx^+$ and $Itx^-$ flow through the transmission coil 13. As a result, a magnetic field M (magnetic flux B) is generated from the transmission coil 13 to the reception coil 23.

The output current of the transmission circuit variable current amplification unit 122 is controlled by the variable current control unit 123. Therefore, the transmission currents $Itx^+$ and $Itx^-$ are changed by control of the variable current control unit 123. If the transmission currents $Itx^+$ and $Itx^-$ are changed, the strength of the magnetic field M (magnetic flux B) generated from the transmission coil 13 to the reception coil 23 is also changed. The transmission circuit variable current amplification unit 122 may be referred to as an amplification unit that changes the strength of the magnetic field M (magnetic flux B).

A voltage Vrx corresponding to the magnetic field M (magnetic flux B) is generated in the reception coil 23. A reception circuit unit input signal $Srx\_in^+$ is output to the reception coil first output terminal 23A1 in response to the magnetic field M (magnetic flux B) and a reception circuit unit input signal $Srx\_in^-$ is output to the reception coil second output terminal 23A2 in response to the magnetic field M (magnetic flux B). The reception circuit voltage amplification unit 221 amplifies the reception circuit unit input signals $Srx\_in^+$ and $Srx\_in^-$. The reception circuit voltage amplification unit 221 outputs the amplified signals as reception circuit unit output signals Srx_out to a reception signal processing unit or the like (not illustrated in the drawings) via the reception circuit output unit 21. Different from the semiconductor device 1B according to the third embodiment, an amplification factor of the reception circuit voltage amplification unit 221 is maintained constant.

Here, because the voltage Vrx changes in response to the change in the transmission currents $Itx^+$ and $Itx^-$, the potentials of the reception circuit unit output signals Srx_out output from the reception circuit voltage amplification unit 221 also change in response to the change in the transmission currents $Itx^+$ and $Itx^-$.

As such, in the semiconductor device 1C, the variable current control unit 123 controls the output current of the transmission circuit variable current amplification unit 122, thereby changing a potential of a reception signal Srx output from the reception circuit voltage amplification unit 221. That is, the semiconductor device 1C is a semiconductor device in which a ratio of the potential of the reception signal Srx to the potential of the transmission signal Stx can be changed by changing the output current of the transmission circuit variable current amplification unit 122.

Next, a structure of the transmission circuit variable current amplification unit 122 will be described with reference to FIG. 8. The transmission circuit variable current amplification unit 122 has a pair of transistors (FET3 and FET4) composed of N-type MOSFETs, a current source Ic3 connected between a drain of FET4 and a power supply Vd, a current source Ic4 connected between a drain of FET4 and the power supply Vd, and a variable current source Ib connected between the sources of the pair of transistors (FET3 and FET4) and a ground G. The drains of FET3 and FET4 are connected to the power supply Vd. A characteristic of the current source Ic3 and a characteristic of the current source Ic4 are the same. In addition, a predetermined bias voltage is applied to a gate of FET3 or FET4 (in FIG. 8, a predetermined bias voltage Vb is applied to the gate of FET4).

The transmission circuit current amplification unit input terminal 121A corresponds to the gate of FET3 or FET4 (in FIG. 8, FET3) and the transmission circuit current amplification unit first output terminal 121B1 corresponds to the drain of FET3. The transmission circuit current amplification unit second output terminal 121B2 corresponds to the drain of FET4. In addition, the variable current control unit 123 is connected to the variable current source Ib. A current of the variable current source Ib is changed by a control voltage output from the variable amplification factor control unit 226. As a result, the currents output from FET3 and FET4 are changed. That is, the output current of the transmission circuit variable current amplification unit 122 is changed by the current of the variable current source Ib. Therefore, the transmission circuit variable current amplification unit 122 illustrated in FIG. 8 functions as an amplification unit capable of changing the output current.

The transmission signal Stx is input to the gate of FET3. The transmission current $Itx^+$ is output from the drain of FET3. $Itx^-$ is output from the drain of FET4. It is input to the gate. Srx is output from the drain of FET2. The transmission currents $Itx^+$ and $Itx^-$ are changed by the current of the variable current source Ib. In the transmission circuit variable current amplification unit 122, a pair of transistors composed of P-type MOSFETs may be used.

According to the semiconductor device 1C according to the fourth embodiment, the following effects are achieved. The semiconductor device 1C according to the fourth embodiment is a semiconductor device in which the transmission circuit unit 12 has the transmission circuit variable current amplification unit 122 that outputs the transmission circuit unit output signals Stx_out$^+$ and Stx_out$^-$ having the current corresponding to the transmission-side potential Etx to the transmission coil 13 and the variable current control unit 123 that controls the transmission circuit variable current amplification unit 122 to change the transmission currents Itx$^+$ and Itx$^-$ of the transmission circuit unit output signals Stx_out$^+$ and Stx_out$^-$ and the variable current control unit 123 controls the transmission circuit variable current amplification unit 122 to change the transmission currents Itx$^+$ and Itx$^-$ of the transmission circuit unit output signals Stx_out$^+$ and Stx_out$^-$, thereby changing the ratio of the reception-side potential Erx to the transmission-side potential Etx. Therefore, the semiconductor device 1C can be used for various uses.

Next, the structures of the semiconductor devices according to the first to fourth embodiments including the other semiconductor chips omitted in the description so far will be described with reference to FIGS. 9 and 10.

Figure 9:
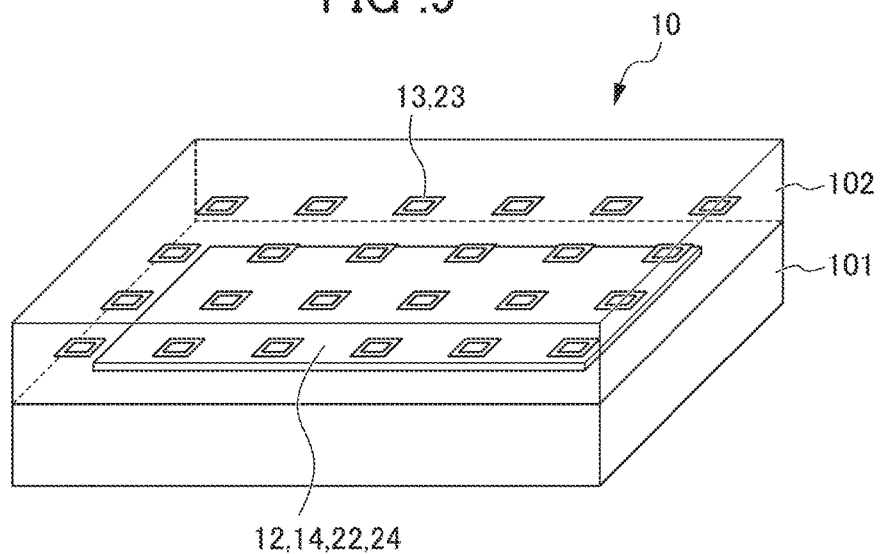
FIG. 9 is an internal transparent perspective view of semiconductor chips according to the first to fourth embodiments.

As illustrated in FIG. 9, the first semiconductor chip 10 in each of the semiconductor devices according to the first to fourth embodiments includes a semiconductor substrate portion 101 and an insulating layer portion 102. The semiconductor substrate portion 101 is a substrate made of silicon. The insulating layer portion 102 is made of silicon oxide.

The transmission circuit unit 12, the reception circuit unit 22, the transmission signal processing unit 14, the reception signal processing unit 24, and the like are formed on the semiconductor substrate portion 101. The insulating layer portion 102 is stacked (disposed) on the semiconductor substrate portion 101 to cover the semiconductor substrate portion 101, the transmission circuit unit 12, and the reception circuit unit 22. A plurality of transmission coils 13 and a plurality of reception coils 23 are formed in the insulating layer portion 102. The transmission coils 13 are connected to the transmission circuit unit 12 by wiring lines (not illustrated in the drawings) formed in the insulating layer portion 102. The reception coils 23 are connected to the reception circuit unit 22 by the wiring lines (not illustrated in the drawings) formed in the insulating layer portion 102. The total thickness of the semiconductor substrate portion 101 and the insulating layer portion 102 is, for example, 2 μm to 25 μm.

In the description of FIGS. 1, 3, 5, and 7 (the first to fourth embodiments), the first semiconductor chip 10 is provided with only the transmission-related configuration (the transmission circuit input unit 11, the transmission circuit unit 12, the transmission coil 13, and the transmission signal processing unit 14) and the second semiconductor chip 20 is provided with only the reception-related configuration (the reception coil 23, the reception circuit unit 22, the reception circuit output unit 21, and the reception signal processing unit 24). However, the illustration of FIGS. 1, 3, 5, and 7 is simplified for the convenience of description and a plurality of transmission-related configurations and a plurality of reception-related configurations are provided in an actual semiconductor chip.

Some or all transmission coils 13 are disposed to overlap the transmission circuit unit 12 and the reception circuit unit 22 in a vertical direction X. Some or all reception coils 23 are disposed to overlap the transmission circuit unit 12 and the reception circuit unit 22 in the vertical direction X. Therefore, an area of a region needed to arrange the transmission coils 13 and the reception coils 23 can be reduced. The second semiconductor chip 20 and the other semiconductor chips have the same structure as that of the semiconductor chip 10.

Figure 10:
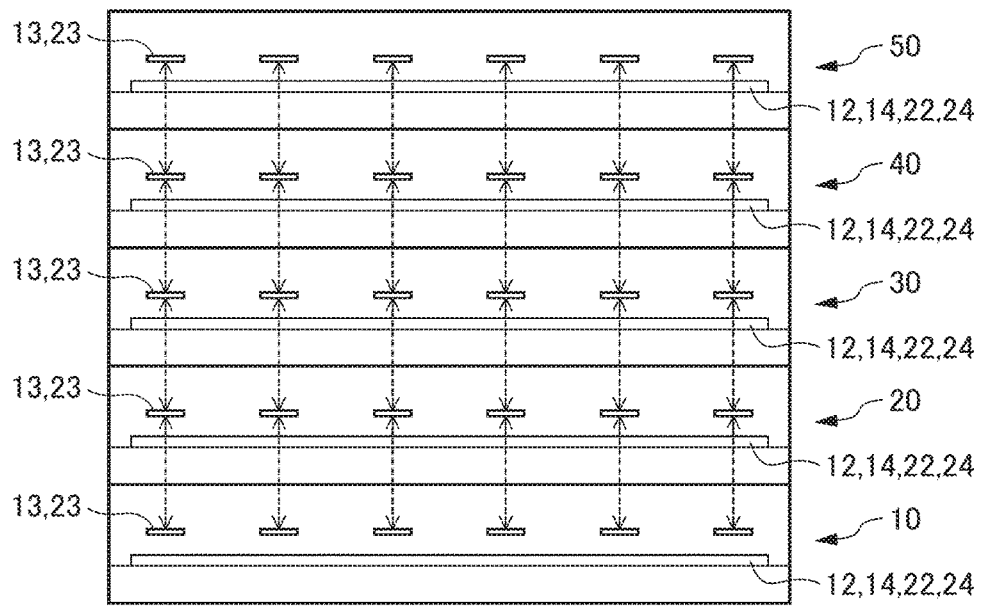
FIG. 10 is a schematic cross-sectional view for explaining non-contact communication in the semiconductor devices according to the first to fourth embodiments.

As illustrated in FIG. 10, each of the semiconductor devices according to the first to fourth embodiments includes five (a plurality of) semiconductor chips 10 to 50. Two of the five semiconductor chips 10 to 50 are the first semiconductor chip 10 and the second semiconductor chip 20 described in the first to fourth embodiments. As described above, in the semiconductor devices 1, 1A, 1B, and 1C according to the first to fourth embodiments, the configurations of the transmission circuit unit 12 and the reception circuit unit 22 are different. However, all of the semiconductor devices 1, 1A, 1B, and 1C according to the first to fourth embodiments are semiconductor devices having a structure illustrated in FIG. 10.

As shown by dotted arrows Y of FIG. 10, at least a part of the non-contact communication between the facing coils (the transmission coil 13 and the reception coil 23) is performed by the transmission circuit unit 12, the reception circuit unit 22, the transmission signal processing unit 14, the reception signal processing unit 24, and the like. Such communication is peculiar to the non-contact communication and cannot be realized by TSV.

The plurality of semiconductor chips have been described as the five semiconductor chips. However, the present invention is not limited thereto. Because the thickness of each semiconductor chip is about 2 μm to 25 μm, multiple semiconductor chips can be bonded. For example, the total thickness of a semiconductor device in which 128 semiconductor chips each having a thickness of 5 μm are bonded is about 640 μm.

[Fifth Embodiment]

Figure 11A:
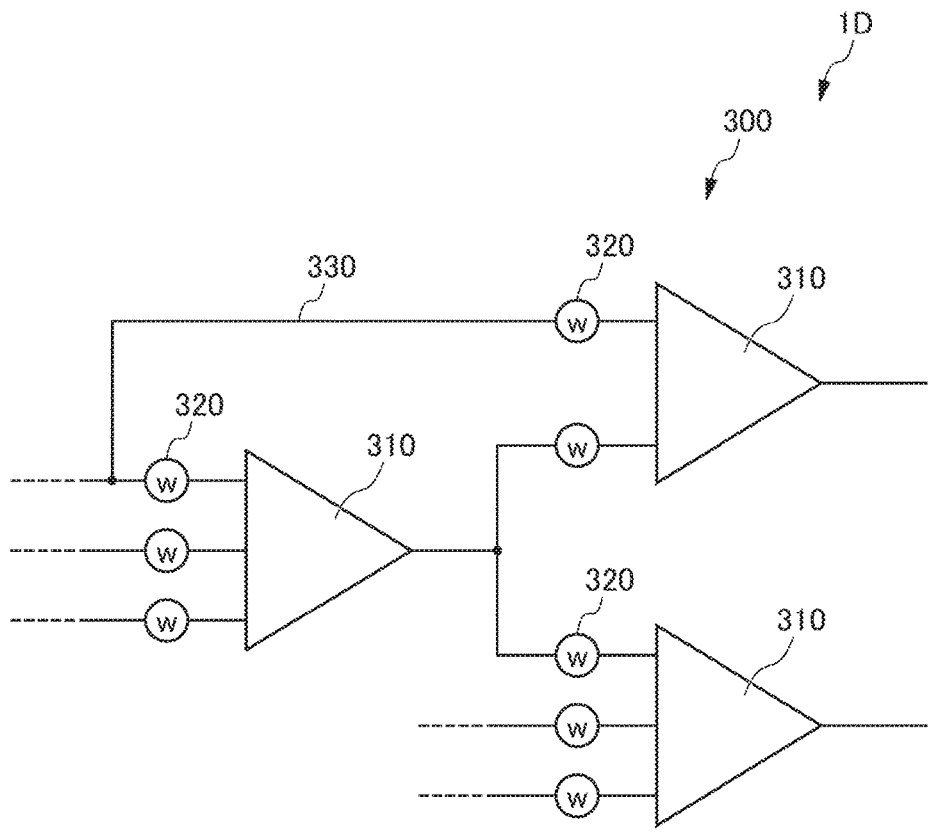
Figure 11B:
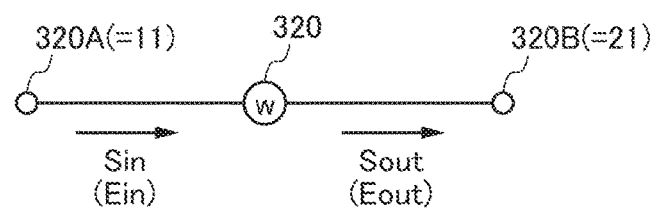

Next, a fifth embodiment will be described with reference to FIGS. 11A and 11B. FIGS. 11A and 11B are diagrams for explaining a neuro-semiconductor device according to the fifth embodiment and FIG. 11A is a diagram for explaining a neuro-network in the neuro-semiconductor device and FIG. 11B is a diagram for explaining a synaptic connection portion.

As illustrated in FIG. 11A, a neuro-network 300 in a neuro-semiconductor device 1D according to the fifth embodiment includes neuron portions 310, synaptic connection portions 320, and a nerve fiber wiring line 330. Each of the neuron portions 310 is a portion with an operation function that imitates nerve cells. The synaptic connection portion 320 is a portion with a function of weighting an input signal and outputting a weighted signal. The nerve fiber wiring line 330 is a wiring line corresponding to a function of the nerve fiber. The neuron portions 310 are connected to each other by the nerve fiber wiring line 330 via the synaptic connection portions 320.

A plurality of signals weighted by synaptic connection are input to the neuron portion 310. The neuron portion 310 performs a predetermined operation and outputs a signal when an operation result satisfies a predetermined condition. When the predetermined condition is satisfied, the neuron portion may be expressed as "ignited".

As illustrated in FIG. 11B, the synaptic connection portion 320 has a synaptic connection portion input terminal 320A and a synaptic connection portion output terminal 320B. A synaptic input signal Sin input to the synaptic connection portion input terminal 320A is a signal with a synaptic input-side potential Ein. In addition, a synaptic output signal Sout output from the synaptic connection portion output terminal 320B is a signal with a synaptic output-side potential Eout. The synaptic connection portion 320 outputs the synaptic input signal Sin (synaptic input-side potential Ein) multiplied by a predetermined weighting coefficient w as the synaptic output signal Sout (synaptic output-side potential Eout). That is, Eout=w×Ein is satisfied.

A weighting coefficient w of the synaptic connection portion 320 is a variable that changes according to a situation. Therefore, the synaptic connection portion 320 may be referred to as a portion that can change the synaptic output-side potential Eout of the synaptic output signal Sout output from the synaptic connection portion 320 to the synaptic input-side potential Ein of the synaptic input signal Sin input to the synaptic connection portion 320.

A change in the weighting coefficient w of the synaptic connection portion 320 is for expressing a situation in which a specific nerve is activated in a human brain when the specific nerve is frequently used.

For example, the weighting coefficient w of the synaptic connection portion 320 changes depending on a communication amount per unit time (the number of signals input to the synaptic connection portion 320 per unit time). When the communication amount per unit time is small, the weighting coefficient w decreases and when the communication amount per unit time is large, the weighting coefficient w increases. For example, the weighting coefficient w of the synaptic connection portion 320 decreases with time while the weighting coefficient w of the synaptic connection portion 320 is not communicated (while no signal is input to the synaptic connection portion 320). The temporal decrease of the weighting coefficient w of the synaptic connection portion 320 can express forgetting of synaptic connection.

Here, as described above, the semiconductor devices according to the first to fourth embodiments are semiconductor devices in which a ratio of a reception-side potential Erx of a reception circuit unit output signal Srx_out to a transmission-side potential Etx of a transmission circuit unit input signal Stx_in input to a transmission circuit input unit 11 can be changed. Therefore, the semiconductor devices according to the first to fourth embodiments can be used as the synaptic connection portions 320. In the neuro-semiconductor device 1D according to the fifth embodiment, any one of the semiconductor devices according to the first to fourth embodiments is used as the synaptic connection portion 320. The transmission circuit input unit 11 corresponds to the synaptic connection portion input terminal 320A and the reception circuit output unit 21 corresponds to the synaptic connection portion output terminal 320B.

When the semiconductor device 1 according to the first embodiment is used as the neuro-semiconductor device, the change in the weighting coefficient w is realized by the reception coil turn number control unit 223. By increasing the number of turns of the reception coil 23 with the reception coil turn number control unit 223, the weighting coefficient w increases. By decreasing the number of turns of the reception coil 23 with the reception coil turn number control unit 223, the weighting coefficient w decreases. In addition, the number of turns of the reception coil 23 can be changed according to the number of transmission circuit unit input signals Stx_in input to the transmission circuit input unit 11 per unit time. In addition, when the state in which the transmission circuit unit input signal Stx_in to be input to the transmission circuit input unit 11 is not input is continuously maintained for a predetermined time, the number of turns of the reception coil 23 can be reduced. Therefore, temporal reduction of the weighting coefficient w of the synaptic connection portion 320 is realized.

When the semiconductor device 1A according to the second embodiment is used as the neuro-semiconductor device, the change in the weighting coefficient w is realized by the reception coil selection unit 224. By selecting the reception coil 23 having a large area with the reception coil selection unit 224, the weighting coefficient w increases. By selecting the reception coil 23 having a small area with the reception coil selection unit 224, the weighting coefficient w decreases. In addition, the area of the reception coil 23 to be selected can be switched according to the number of transmission circuit unit input signals Stx_in input to the transmission circuit input unit 11 per unit time. In addition, when the state in which the transmission circuit unit input signal Stx_in to be input to the transmission circuit input unit 11 is not input is continuously maintained for a predetermined time, switching to a coil having a relatively small area is enabled. Therefore, temporal reduction of the weighting coefficient w of the synaptic connection portion 320 is realized.

When the semiconductor device 1B according to the third embodiment is used as the neuro-semiconductor device, the change in the weighting coefficient w is realized by the variable amplification factor control unit 226. By increasing the amplification factor of the reception circuit voltage variable amplification unit 225 with the variable amplification factor control unit 226, the weighting coefficient w increases. By decreasing the amplification factor of the reception circuit voltage variable amplification unit 225 with the variable amplification factor control unit 226, the weighting coefficient w decreases. In addition, the amplification factor of the reception circuit voltage variable amplification unit 225 can be changed according to the number of transmission circuit unit input signals Stx_in input to the transmission circuit input unit 11 per unit time. In addition, when the state in which the transmission circuit unit input signal Stx_in to be input to the transmission circuit input unit 11 is not input is continuously maintained for a predetermined time, the amplification factor of the reception circuit voltage variable amplification unit 225 can be reduced with time. The temporal reduction of the amplification factor of the reception circuit voltage variable amplification unit 225 can be realized by temporal reduction of a control voltage to the variable current source Ia of FIG. 6. The temporal reduction of the control voltage can be realized, for example, with a peak hold circuit having a predetermined time constant. Therefore, temporal reduction of the weighting coefficient w of the synaptic connection portion 320 is realized.

When the semiconductor device 1C according to the fourth embodiment is used as the neuro-semiconductor device, the change in the weighting coefficient w is realized by the variable current control unit 123. By increasing the output current of the transmission circuit variable current amplification unit 122 (increasing transconductance) with the variable current control unit 123, the weighting coefficient w increases. By decreasing the output current of the transmission circuit variable current amplification unit 122 (decreasing transconductance) with the variable current control unit 123, the weighting coefficient w decreases. In addition, the output current of the transmission circuit variable current amplification unit 122 can be changed according to the number of transmission circuit unit input signals Stx_in input to the transmission circuit input unit 11 per unit time (transconductance can be changed). In addition, when the state in which the transmission circuit unit input signal Stx_in to be input to the transmission circuit input unit 11 is not input is continuously maintained for a predetermined time, the output current of the transmission circuit variable current amplification unit 122 can be reduced with time (transconductance can be reduced with time). The temporal reduction of the amplification factor of the reception circuit voltage variable amplification unit 225 can be realized by temporal reduction of a control voltage to the variable current source Ib of FIG. 8. The temporal reduction of the control voltage can be realized, for example, with a peak hold circuit having a predetermined time constant. Therefore, temporal reduction of the weighting coefficient w of the synaptic connection portion 320 is realized.

When the semiconductor devices according to the first to fourth embodiments are used as the neuro-semiconductor device 1D, the change in the weighting coefficient w of the synaptic connection portion 320 can be realized by autonomous control (automatic control in which instructions from the outside of the neuro-semiconductor device 1D are not received).

The whole human brain has about 100 billion neurons and 100 trillion or more synaptic connections. That is, about 1000 synaptic connections exist in one neuron. The whole human brain can be simulated by the neuro-semiconductor device 1D according to the fifth embodiment. This is because each semiconductor chip of the neuro-semiconductor device 1D according to the fifth embodiment is thin and the occupancy area of each coil thereof is smaller than that of TSV or the like.

The embodiments of the present invention have been described. However, the present invention is not limited to the embodiments and various modifications can be made within a technical scope described in claims.

In the first to fifth embodiments, the first semiconductor chip 10 and the second semiconductor chip 20 are adjacent to each other in the vertical direction. However, the present invention is not limited thereto. The first semiconductor chip 10 and the second semiconductor chip 20 may not be adjacent to each other and another semiconductor chip may exist between the first semiconductor chip 10 and the second semiconductor chip 20. In addition, the second semiconductor chip 20 is disposed on the first semiconductor chip 10. However, the second semiconductor chip 20 may be disposed below the first semiconductor chip 10. The transmission coil 13 of the first semiconductor chip 10 and the reception coil 23 of the second semiconductor chip 20 may be magnetically coupled (inductively coupled).

The first semiconductor chip 10 and the second semiconductor chip 20 are adjacent to each other in the vertical direction. However, the present invention is not limited thereto. The first semiconductor chip 10 and the second semiconductor chip 20 may not be adjacent to each other and another semiconductor chip may exist between the first semiconductor chip 10 and the second semiconductor chip 20. In addition, the second semiconductor chip 20 is disposed on the first semiconductor chip 10. However, the second semiconductor chip 20 may be disposed below the first semiconductor chip 10. The transmission coil 13 of the first semiconductor chip 10 and the reception coil 23 of the second semiconductor chip 20 may be magnetically coupled (inductively coupled).

In addition, in the first embodiment, the three reception circuit switches are provided and the number of turns of the reception coil 23 is changed in three steps. However, the present invention is not limited thereto. The number of reception circuit switches may be other than three and the number of turns may be changed in two steps or more.

In addition, in the first embodiment, the variable turn number coil (reception coil 23) and the coil turn number control unit (reception coil turn number control unit 223) are provided on the second semiconductor chip 20 (reception side). However, the present invention is not limited thereto. The variable turn number coil and the coil turn number control unit may be provided on the side of the first semiconductor chip 10 (transmission side). Specifically, the transmission circuit unit 12 may be provided with a transmission circuit switch unit and a transmission coil turn number control unit and the transmission coil 13 may be a variable turn number transmission coil. In addition, in the transmission coil 13 or the reception coil 23, the number of turns per unit length may be variable. In addition, in each of the first semiconductor chip 10 and the second semiconductor chip 20, a variable turn number coil, a switch unit, and a coil turn number control unit may be provided.

In addition, in the second embodiment, the reception coil is composed of the three coils. However, the present invention is not limited thereto. The reception coil may be composed of two coils or more.

In addition, in the second embodiment, the plurality of coils (the first reception coil 23-1, the second reception coil 23-2, and the third reception coil 23-3) and the coil selection unit (the reception coil selection unit 224) are provided on the side of the second semiconductor chip 20 (reception side). However, the present invention is not limited thereto. The plurality of coils and the coil selection unit may be provided on the side of the first semiconductor chip 10 (transmission side). Specifically, the transmission circuit unit 12 may be provided with a transmission circuit switch unit and a transmission coil selection unit and the transmission coil 13 may be a plurality of transmission coils. In addition, in each of the first semiconductor chip 10 and the second semiconductor chip 20, a plurality of coils, a switch unit, and a coil selection unit may be provided.

In addition, in the second embodiment, any one of a plurality of reception coils and a plurality of transmission coils or both the plurality of reception coils and the plurality of transmission coils may be the variable turn number coils illustrated in the first embodiment. More specifically, a part or all of the plurality of reception coils may be the variable turn number coils and a part or all of the plurality of transmission coils may be the variable turn number coils.

In addition, in the third and fourth embodiments, the magnetic coupling (inductive coupling) between the coils is used for the non-contact communication. However, the present invention is not limited thereto. For the non-contact communication, magnetic resonance between coils may be used. In addition, coils may not be used for non-contact signal transmission and reception. For example, an optical signal or a sound wave signal may be used.

In addition, in the second embodiment, the plurality of coils are arranged on the same plane. However, the present invention is not limited thereto. The plurality of coils may be arranged on different planes. In addition, the plurality of coils are arranged as coaxial coils. However, the present invention is not limited thereto. The plurality of coils may be arranged such that the magnetic coupling (inductive coupling) is enabled.

In addition, in the second embodiment, the plurality of coils are coils having different areas. However, the present invention is not limited thereto. The plurality of coils may be coils of different numbers of turns. The plurality of coils may be coils having different characteristics.

In addition, in the first to fifth embodiments, the semiconductor substrate portion 101 is a substrate made of silicon. However, the present invention is not limited thereto. The semiconductor substrate portion 101 may be formed of a semiconductor material (for example, a compound semiconductor such as GaAs) other than silicon. In addition, the insulating layer portion 102 is made of silicon oxide. However, the present invention is not limited thereto. The insulating layer portion 102 may be made of an insulating material (for example, silicon nitride or the like) other than silicon oxide and may be formed by stacking two or more kinds of insulating materials.

In addition, in the first to fifth embodiments, fusion bonding is used as the bonding method. However, the present invention is not limited thereto. For example, the bonding method may be a method using an adhesive and may be a surface activated normal temperature bonding method or the like.

EXPLANATION OF REFERENCE NUMERALS 1, 1A, 1B, 1C: semiconductor device
1D: neuro-semiconductor device
10: first semiconductor chip
11: transmission circuit input unit
12: transmission circuit unit
121: transmission circuit current amplification unit
121A: transmission circuit current amplification unit input terminal
121B1: transmission circuit current amplification unit first output terminal
121B2: transmission circuit current amplification unit second output terminal
122: transmission circuit variable current amplification unit
123: variable current control unit
13: transmission coil (transmission unit)
131A1: transmission coil first input terminal
131A2: transmission coil second input terminal
14: transmission signal processing unit
20: second semiconductor chip
21: reception circuit output unit
22: reception circuit unit
221: reception circuit voltage amplification unit
221A1: reception circuit voltage amplification unit first input terminal
221A2: reception circuit voltage amplification unit second input terminal
221B: reception circuit voltage amplification unit output terminal
222: reception circuit switch unit
222A1: first reception circuit switch
222A2: second reception circuit switch
222A3: third reception circuit switch
222A4: fourth reception circuit switch
222A5: fifth reception circuit switch
222A6: sixth reception circuit switch
223: reception coil turn number control unit
224: reception coil selection unit
225: reception circuit voltage variable amplification unit
226: variable amplification factor control unit
23: reception coil (reception unit)
23A1: reception coil first output terminal
23A2: reception coil second output terminal
23A3: reception coil third output terminal
23A4: reception coil fourth output terminal
23-1: first reception coil
23-2: second reception coil
23-3: third reception coil
24: reception signal processing unit
101: semiconductor substrate portion
102: insulating layer portion
300: neuro-network
310: neuron portion
320: synaptic connection portion
330: nerve fiber wiring line
Stx_in: transmission circuit unit input signal
Etx: transmission-side potential
Stx_out$^+$, Stx_out$^-$: transmission circuit unit output signal
Srx_in$^+$, Srx_in$^-$: reception unit input signal
Srx_out: reception circuit unit output signal
Erx: reception-side potential
w: weighting coefficient
J: insulator
M: magnetic field
X: vertical direction

The invention claimed is:

1. A semiconductor device comprising:
a first semiconductor chip that includes a transmission circuit input unit, a transmission circuit unit connected to the transmission circuit input unit, and a transmission unit connected to the transmission circuit unit ; and
a second semiconductor chip that is disposed on or below the first semiconductor chip and includes a reception unit, a reception circuit unit connected to the reception unit, and a reception circuit output unit connected to the reception circuit unit,
wherein the transmission unit and the reception unit communicate with each other in a non-contact manner,
a transmission circuit unit input signal having a predetermined transmission-side potential is input into the transmission circuit unit via the transmission circuit input unit, the transmission circuit unit outputs a transmission circuit unit output signal corresponding to the transmission circuit unit input signal, and the transmission circuit unit output signal is input as a reception circuit unit input signal to the reception circuit unit via the non-contact communication between the transmission unit and the reception unit,
the reception circuit unit outputs a reception circuit unit output signal corresponding to a voltage of the reception circuit unit input signal and having a predetermined reception-side potential, to the reception circuit output unit,
a ratio of the reception-side potential to the transmission-side potential is changed,
the transmission unit is a transmission coil,
the reception unit is a reception coil,
the reception coil is a variable turn number reception coil capable of changing a number of turns,
the reception circuit unit has a reception coil turn number control unit that changes the number of turns of the variable turn number reception coil, and
the reception coil turn number control unit changes the number of turns of the variable turn number reception coil to change the ratio of the reception-side potential to the transmission-side potential.

2. The semiconductor device according to claim 1, wherein
the transmission coil is a variable turn number transmission coil capable of changing the number of turns,
the transmission circuit unit has a transmission coil turn number control unit that changes the number of turns of the variable turn number transmission coil, and
the transmission coil turn number control unit changes the number of turns of the variable turn number transmission coil to change the ratio of the reception-side potential to the transmission-side potential.

3. The semiconductor device according to claim 1, wherein
the reception coil has a plurality of reception coils,
the reception circuit unit has a reception coil selection unit that selects any one of the plurality of reception coils, and
the reception coil selection unit changes the reception coil to be selected, thereby changing the ratio of the reception-side potential to the transmission-side potential.

4. The semiconductor device according to claim 1, wherein
the transmission unit has a plurality of transmission coils,
the transmission circuit unit has a transmission coil selection unit that selects at least one of the plurality of coils, and
the transmission coil selection unit changes the transmission coil to be selected, thereby changing the ratio of the reception-side potential to the transmission-side potential.

5. The semiconductor device according to claim 1, wherein the reception circuit unit has a reception circuit voltage variable amplification unit that amplifies the reception circuit unit input signal and outputs the reception circuit unit output signal and a variable amplification factor control unit that controls the reception circuit voltage variable amplification unit to change an amplification factor of the reception circuit voltage variable amplification unit, and
wherein the variable amplification factor control unit controls the reception circuit voltage variable amplification unit to change the amplification factor of the reception circuit voltage variable amplification unit, thereby changing the ratio of the reception-side potential to the transmission-side potential.

6. The semiconductor device according to claim 1, wherein
the transmission circuit unit has a transmission circuit variable current amplification unit that outputs a transmission unit output current signal having a current corresponding to the transmission-side potential to the transmission coil and a variable current control unit that controls the transmission circuit variable current amplification unit to change the current of the transmission unit output current signal, and
the variable current control unit controls the transmission circuit variable current amplification unit to change the current of the transmission unit output current signal, thereby changing the ratio of the reception-side potential to the transmission-side potential.

7. The semiconductor device according to claim 1, wherein the semiconductor device includes a plurality of semiconductor chips, and
the semiconductor chips adjacent to each other in a vertical direction are bonded directly to each other and each of the first semiconductor chip and the second semiconductor chip is one of the plurality of semiconductor chips.

8. The semiconductor device according to claim 1, further comprising:
a plurality of synaptic connection portions, each of which has a synaptic connection input unit and a synaptic connection output unit; and
a plurality of neuron portions that are connected to each other via the plurality of synaptic connection portions,
wherein the synaptic connection input unit is the transmission circuit input unit,
the synaptic connection output unit is the reception circuit output unit, and
a weighting coefficient of the synaptic connection portion is changed by changing the ratio of the transmission-side potential and the reception-side potential.

9. The semiconductor device according to claim 8, wherein
the weighting coefficient of the synaptic connection portion is changed according to the number of transmission circuit unit input signals input to the transmission circuit input unit per unit time.

10. The semiconductor device according to claim 8, wherein
the weighting coefficient of the synaptic connection portion is reduced with time while the transmission circuit unit input signal is not input to the transmission circuit input unit.

* * * * *